US006617632B2

(12) United States Patent
Taniguchi et al.

(10) Patent No.: US 6,617,632 B2
(45) Date of Patent: Sep. 9, 2003

(54) SEMICONDUCTOR DEVICE AND A METHOD OF MANUFACTURING THE SAME

(75) Inventors: Yasuhiro Taniguchi, Kodaira (JP);
Kazuyoshi Shiba, Kodaira (JP);
Nozomu Matsuzaki, Kokubunji (JP);
Hidenori Takada, Higashimurayama (JP); Hitoshi Kume, Musashino (JP);
Shoji Shukuri, Koganei (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/005,300

(22) Filed: Dec. 7, 2001

(65) Prior Publication Data

US 2002/0074569 A1 Jun. 20, 2002

(30) Foreign Application Priority Data

Dec. 19, 2000 (JP) ........................................ 2000-385399

(51) Int. Cl.$^7$ ............................................ H01L 27/108
(52) U.S. Cl. ...................... 257/296; 257/317; 257/330; 257/364; 257/407
(58) Field of Search ................................. 257/317, 330, 257/364, 407

(56) References Cited

U.S. PATENT DOCUMENTS

| | | | |
|---|---|---|---|
| 4,868,619 A | 9/1989 | Mukherjee et al. | 357/23.5 |
| 5,472,891 A | 12/1995 | Komori et al. | 437/43 |
| 5,629,541 A | 5/1997 | Komori et al. | 257/316 |
| 5,912,488 A | 6/1999 | Kim et al. | 257/316 |
| 6,030,869 A | 2/2000 | Odake et al. | 438/266 |
| 6,236,085 B1 | 5/2001 | Kawaguchi et al. | 257/345 |
| 6,521,943 B1 * | 2/2003 | Mine et al. | 257/317 |

FOREIGN PATENT DOCUMENTS

JP  5-182473  7/1993

* cited by examiner

Primary Examiner—David Nelms
Assistant Examiner—Mai-Huong Tran
(74) Attorney, Agent, or Firm—Miles & Stockbridge P.C.

(57) ABSTRACT

A parallel connection-type nonvolatile memory semiconductor device comprises a plurality of memory cells disposed on a semiconductor substrate in matrix form, each including a gate insulating film, a floating gate electrode, an interlayer film and a control gate electrode successively formed so as to cover a channel region on a main surface of the semiconductor substrate, of a first conductivity type; a second conductivity type source and drain regions formed on the semiconductor substrate on both sides opposite to each other, of the floating gate electrode so as to interpose a channel region located under the floating gate electrode therebetween; a first semiconductor region which is adjacent to the drain region and formed by introducing a second conductivity type impurity in the direction of the channel region placed under the floating gate electrode from an end on the drain side, of the floating gate electrode, and which is substantially lower than the drain region in impurity concentration; and a punch-through stopper layer which is adjacent to the first semiconductor region and formed by introducing a first conductivity type impurity in the direction of the channel region placed under the floating gate electrode from an end on the drain side, of the floating gate electrode, and which is substantially higher than the channel region in impurity concentration, and wherein the source regions and drain regions of the plurality of nonvolatile memory cells are parallel-connected to one another in respective columns, word lines some of which constitute the control gate electrodes of the plurality of nonvolatile memory cells, extend in respective rows, a voltage is applied to at least one word line, which is set so as to serve as a selected word line, and when carriers are stored in a floating gate electrode of each selected memory cell, a negative voltage is applied to other non-selected word lines other than the selected word line.

14 Claims, 24 Drawing Sheets

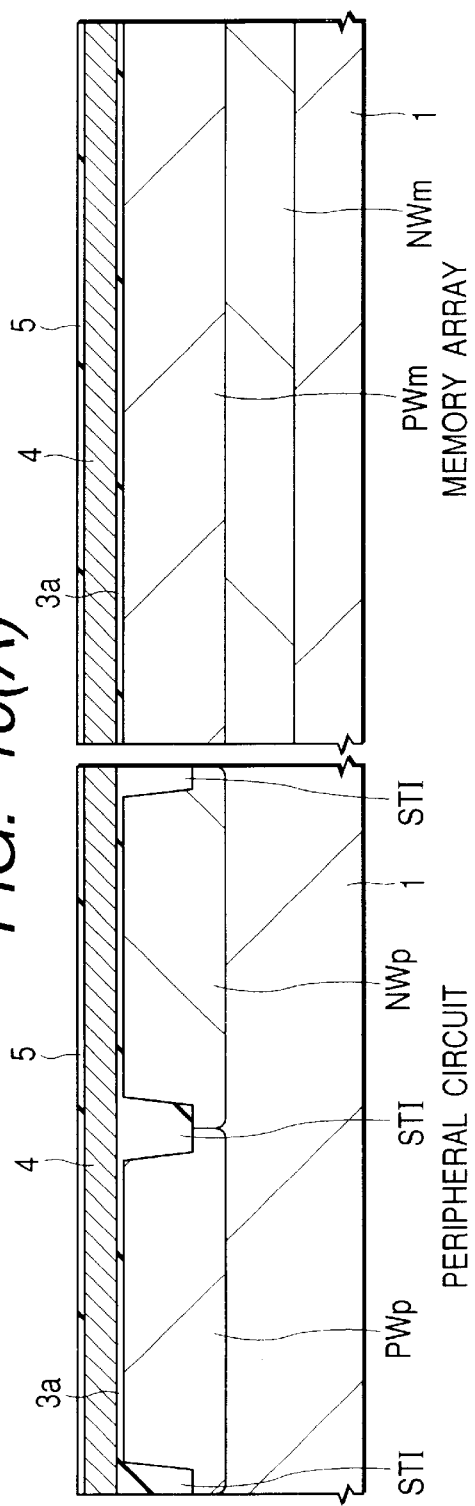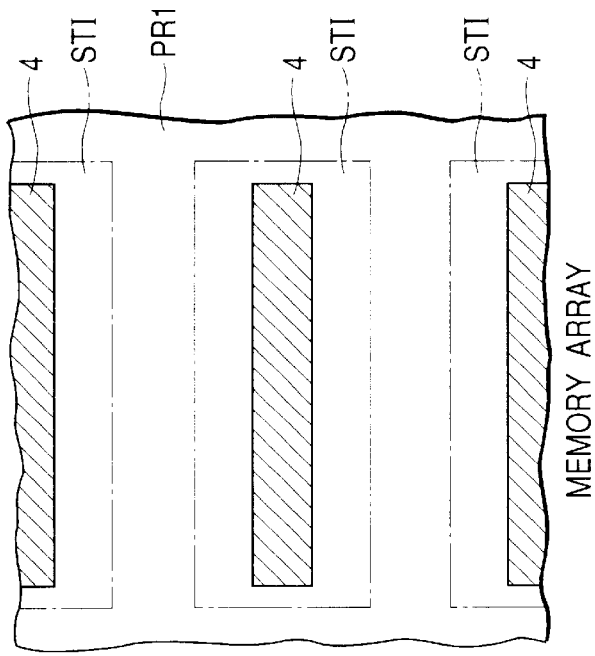
FIG. 10(A)
FIG. 10(B)

SEMICONDUCTOR DEVICE AND A METHOD OF MANUFACTURING THE SAME

TECHNICAL FIELD

The present invention relates to a semiconductor device and a manufacturing technology therefor, and particularly to a technology effective for application to a nonvolatile memory semiconductor device having electrically erasable programmable parallel connection-type nonvolatile memory cells.

BACKGROUND OF THE INVENTION

In a nonvolatile memory semiconductor device, nonvolatile memories capable of electrically writing data therein and erasing the same therefrom are able to rewrite or update data in a state of being built onto a wiring board, for example and are easy to use. Therefore, they have widely been used in various products that need the memories.

In particular, an electrical batch erasure-type EEPROM (Electric Erasable Programmable Read Only Memory: hereinafter called a "Flash memory") has the function of collectively electrically erasing data lying in a predetermined range (including all the memory cells or a predetermined memory cell group in a memory array) of the memory array. Further, since the flash memory has a one-transistor stacked gate structure, the downscaling of each cell is put forward and expectations on high integration thereof are also high.

In the one-transistor stacked gate structure, one nonvolatile memory cell (hereinafter abbreviated simply as "memory cell") basically comprises one two-layer gate MISFET (Metal Insulator Semiconductor Field Effect Transistor). The two-layer gate MISFET is formed by providing a floating gate electrode on a semiconductor substrate with a tunnel oxide film interposed therebetween and stacking a control gate electrode thereon with an interlayer film interposed therebetween.

The storage of data in the flash memory is carried out by injecting electrons into the floating gate electrode or pulling out or extracting the electrons from the floating gate electrode. For example, a NOR type flash memory typified by a parallel connection-type nonvolatile memory carries out data processing in the following manner.

In order to perform the writing of data, a source region and a substrate are grounded and a relatively high voltage is applied to a control gate electrode and a drain region. Thus, electrons move or travel on a channel region near the surface of the substrate from the source region to the drain region at high speed, and electrons each having obtained sufficiently high energy in the neighborhood of the drain region in which the channel region is pinched-off, result in hot electrons. The hot electrons are capable of jumping over a potential barrier of a gate insulating film placed under a floating gate electrode. Owing to an electric field produced by the control gate electrode, the hot electrons get over the barrier of energy and are attracted to and injected into the floating gate electrode. This injection is normally called "hot electron injection" or "channel injection". In the present specification, it will hereinafter be called "HE injection". By doing so, the floating gate electrode is negatively charged and the threshold value as viewed from the control gate electrode becomes higher than a predetermined value. This state in which the threshold voltage is higher than the predetermined value, is called a "data-written state", e.g., a logic "0".

Further, FN tunneling (Fowler-Nordheim tunneling) of the thin gate insulating film placed below the floating gate electrode carries out the erasing of data. When, for example, a relatively high voltage is applied to the control gate electrode in a state in which the source and drain regions are open, electrons lying in the floating gate electrode are pulled out to the semiconductor substrate placed under the floating gate electrode (tunnel emission), and the potential at the floating gate electrode is returned to neutrality, so that the threshold voltage as viewed from the control gate electrode becomes lower than a predetermined value. This state in which the threshold voltage is lower than the predetermined value, is called a "data-erased state", e.g., a logic "1". The FN tunneling can be effected even on a semiconductor region for the source region or drain region located under the floating gate electrode except for the substrate.

Furthermore, in order to carry out the reading of data, a voltage, which ranges from about 3 V to about 5 V, for example, is applied to the control gate electrode. Since, at this time, no current flows in a channel region in the case of a memory cell with data written therein but a current flows in a channel region in the case of a memory cell with data erased therefrom, the logics "1" and "S" can be distinguished from each other, and hence information can be read from the memory cell.

In an actual memory cell array, a plurality of word lines extending in a row direction and a plurality of bit lines extending in a column direction are placed so as to intersect one another. Memory cells are respectively disposed at points where the word lines and the bit lines intersect. The drain regions of the respective memory cells are connected to their corresponding bit lines, and the source regions of the respective memory cells are connected to their corresponding source lines. Thus, when data is written into the corresponding memory cell, both a word line (hereinafter called a "selected word line") and a bit line intended for writing are respectively set to a relatively high voltage. When data is erased from the corresponding memory cell, a selected word line may be set to a relatively high voltage in a state in which a bit line and a source line are open. Such a parallel connection-type nonvolatile memory semiconductor device has been described in U.S. Pat. No. 4,868,619.

Incidentally, while the high integration of the flash memory is put forward on the strength of the progress of extensive technologies such as a micro-fabrication technology, a new circuit technology or a downsized package technology, etc., various problems incident to the scale-down or downsizing of each memory cell arise. Even as to this, however, the scale-down of each memory cell is realized while achieving an improvement in memory cell structure, a change in operating voltage, etc.

For example, in the flash memory having the cell layout of NOR type, which corresponds to one parallel connection type discussed by the present inventors, a problem has been clarified in that upon a punch-through phenomenon due to a short channel effect in the main, and writing, an increase in leak current developed in each memory cell (hereinafter called "non-selected memory cell") unintended for writing, which is connected to each memory cell (hereinafter called "selected memory cell") intended for writing with a bit line shared therebetween will reduce the reliability of the flash memory.

As for the short channel effect, however, an n type semiconductor region, which constitutes a drain region, is surrounded by a punch-through stopper layer indicative of p type conductivity to allow the prevention of punch-through. Namely, the major cause of the short channel effect resides in that a depletion layer developed from the drain region of each memory cell reaches the source region and a current flows between the source and drain regions. However, the suppression of the extension of the depletion layer produced from the drain region by the punch-through stopper layer allows the avoidance of the generation of the short channel effect even if a gate length is about 0.3 µm.

A method of applying a negative voltage to a word line (hereinafter called "non-selected word line") unintended for writing has been adopted to cope with the increase in the leak current developed in the non-selected memory cell. It is thus possible to control or suppress the leak current developed in each non-selected memory cell having a drain region to which a voltage is applied upon writing. Incidentally, for example, Unexamined Patent Publication No. Hei 5(1993)-182473 has been disclosed as an example of the Patent which has described a flash memory wherein a leak blocking voltage is applied to a non-selected word line upon writing.

SUMMARY OF THE INVENTION

On the other hand, when the scale-down of each memory cell is put forward and the width (hereinafter called "gate length") extending in the source and drain regions, of the gate electrode becomes smaller than 0.3 µm, it is considered that there is need to simultaneously apply a method of forming a punch-through stopper layer to control or suppress a short channel effect, and a method of applying a negative voltage to each non-selected word line to suppress a leak current developed in each non-selected memory cell.

As a result of discussions by the present inventors, however, it has been cleared that when the two method are simultaneously applied, a so-called drain disturb phenomenon occurs wherein the threshold voltage of each non-selected memory cell varies upon writing.

Namely, in a non-selected memory cell having a drain region to which a positive voltage (e.g., 6 V) is applied, a depletion layer of an n type semiconductor region, which constitutes the drain region, is hard to extend due to a punch-through stopper layer and an electric field is made steep. In addition to it, the curvature or bending of a band is rendered steep due to a negative voltage (e.g., −2.5 V) applied to a non-selected word line on the surface of a channel region near the drain region, and each electron-hole pair is dissociated at a drain end to thereby make it easy to cause avalanche hot carriers. Thus, the hot holes are injected to a floating gate electrode, so that the threshold voltage is varied.

With a view toward suppressing the variation in threshold voltage, there is need to relax the electric field at the drain region, and the application of an LDD (Lightly Doped Drain) structure has been considered wherein a n-type semiconductor region relatively low in impurity concentration is formed between a punch-through stopper layer and an n type semiconductor region constituting the drain region. However, the LDD structure is still accompanied by the problem in that since a region in which an electric field lying in a channel horizontal direction reaches the maximum, is placed under an insulating film provided on sidewalls of a floating gate electrode, the efficiency of injection of HE at writing is reduced.

An object of the present invention is to provide a technology capable of preventing a drain disturb phenomenon in a nonvolatile memory semiconductor device having nonvolatile memory cells for a short channel.

Another object of the present invention is to provide a technology capable of improving the efficiency of injection of HE at writing and achieve the speeding up of a write operation in a nonvolatile memory semiconductor device having nonvolatile memory cells for a short channel.

The above, other objects, and novel features of the present invention will become apparent from the following description of the present specification and the accompanying drawings.

Summaries of typical ones of the inventions disclosed in the present application will be described in brief as follows:

(1) A parallel connection-type nonvolatile memory semiconductor device of the present invention comprises a plurality of memory cells arranged on a semiconductor substrate in matrix form. Each of the plurality of memory cells includes a gate insulating film, a floating gate electrode, an interlayer film and a control gate electrode successively formed so as to cover a channel region on a main surface of the semiconductor substrate, of a first conductivity type; a second conductivity type source and drain regions formed on the semiconductor substrate on both sides opposite to each other, of the floating gate electrode so as to interpose a channel region located under the floating gate electrode therebetween; a first semiconductor region which is adjacent to the drain region and formed by introducing a second conductivity type impurity in the direction of the channel region placed under the floating gate electrode from an end on the drain side, of the floating gate electrode, and which is substantially lower than the drain region in impurity concentration; and a punch-through stopper layer which is adjacent to the first semiconductor region and formed by introducing an impurity of a first conductivity type in the direction of the channel region placed under the floating gate electrode from an end on the drain side, of the floating gate electrode, and which has an impurity concentration relatively higher than that of the channel region.

The source and drain regions of the plurality of memory cells are parallel-connected to one another in respective columns. Word lines some of which constitute the control gate electrodes of the plurality of memory cells, extend in respective rows. A voltage is applied to at least one word line, which in turn is set so as to serve as a selected word line. When carriers are stored in a floating gate electrode of a selected memory cell, a negative voltage is applied to non-selected word lines other than the selected word line.

(2) A method of manufacturing a semiconductor device, according to the present invention comprises the steps of forming a gate insulating film covering a channel region on a main surface of a semiconductor substrate of a first conductivity type, a floating gate electrode, an interlayer film and a control gate electrode; forming a second conductivity type source and drain regions on the semiconductor substrate on both sides opposite to each other, of the floating gate electrode so as to interpose a channel region located under the floating gate electrode therebetween; introducing an impurity of a first conductivity type into the semiconductor substrate from an end on the drain side, of the floating gate electrode to thereby form a punch-through stopper layer adjacent to the drain region and having an impurity concentration relatively higher than that of the channel region; and introducing an impurity of a second conductivity type into the semiconductor substrate from an end on the drain side, of the floating gate electrode to thereby form a first semiconductor region adjacent to the drain region and substantially lower than the drain region in impurity concentration.

According to the above means, a first semiconductor region substantially lower than a drain region in impurity concentration is formed between the drain region and a punch-through stopper layer, so that an electric field at a junction of the punch-through stopper layer is relaxed. Thus, even if the punch-through stopper layer having the function of preventing a short channel effect is provided and a negative voltage is applied to a control gate electrode of each non-selected memory cell to suppress a leak current developed in the non-selected memory cell upon writing, a drain disturb phenomenon can be prevented from occurring.

Further, since a punch-through stopper layer and a first semiconductor region substantially lower than a drain region in impurity concentration are provided below a floating gate electrode, a channel region to which an electric field lying in a channel horizontal direction is applied, becomes wide. Thus, the number of electrons accelerated until they have energy necessary for the injection of HE, increases and the efficiency of the injection of HE at the writing of data into each memory cell can be enhanced.

Other means of the present invention will become apparent from the description of embodiments which refer to the following drawings.

BRIEF DESCRIPTION OF THE DRAWINGS

FIG. 10(A) is a fragmentary cross-sectional view of the semiconductor substrate illustrating one example of the method of manufacturing the flash memory according to one embodiment of the present invention in process order;

FIG. 10(B) is a fragmentary cross-sectional view of the semiconductor substrate depicting one example of the method of manufacturing the flash memory according to one embodiment of the present invention in process order;

DETAILED DESCRIPTION OF THE PREFERRED EMBODIMENTS

Figure 1:
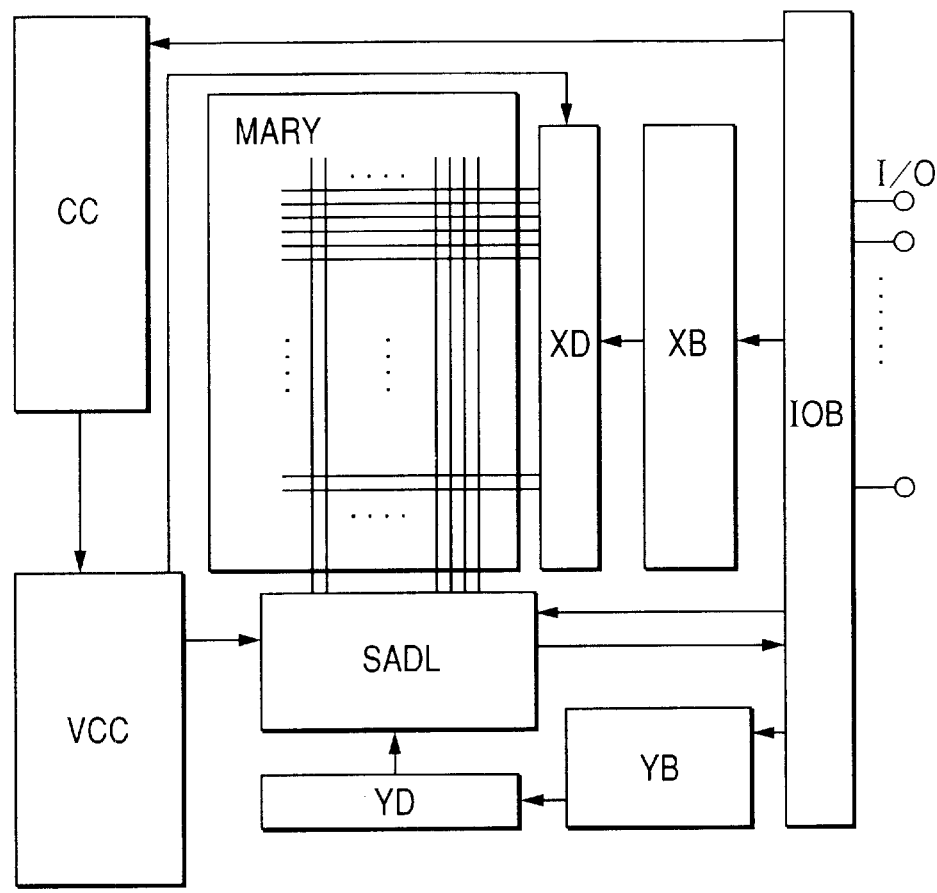
FIG. 1 is a diagram for describing a block configuration of a flash memory according to one embodiment of the present invention.

Preferred embodiments of the present invention will hereinafter be described in detail with reference to the accompanying drawings. Incidentally, members or elements each having the same function in all the drawings for describing the embodiments are respectively identified by the same reference numerals and their repetitive description will be omitted.

In the present embodiments, each of "MISFETs" and "MOSFETs (Metal Oxide Semiconductor Field Effect Transistors)" is a general term for field effect transistors, which will be abbreviated as "MOSs". p channel type MOSFETs are abbreviated as "PMOSs", and n channel MOSFETs are abbreviated as "NMOSs".

Embodiment 1

FIG. 1 shows one example of a block diagram of a flash memory showing an embodiment 1 of the present invention. An outline of a configuration of the flash memory according to the embodiment 1 will first be described based on the same drawing.

A row decoder XD for selecting each of word lines is connected to a memory array MARY, and a column decoder YD for selecting each of bit lines is connected thereto via a sense amplifier data latch SADL. An input/output buffer IOB is connected to the row decoder XD through a row address buffer XB and connected to a column decoder YD through a column address buffer YB. Further, the input/output buffer IOB is connected even to the sense amplifier data latch SADL and a control circuit CC. The control circuit CC is connected to the row decoder XD and the sense amplifier data latch SADL through a power or voltage control circuit VCC.

The control circuit CC comprises a command decoder, a power switching circuit and a write/erase circuit. The power control circuit VCC comprises a reference voltage generator, a write/erase voltage generator and a verification voltage generator. Here, the reference voltage generator is a circuit for generating reference voltages to be inputted to respective circuits to generate respective predetermined voltages for the write/erase voltage generator and the verification voltage generator or the like. Incidentally, other circuits like the control circuit CC other than the memory array MARY will be called "peripheral circuits" in the following description.

The memory array MARY is placed so as to make up of the majority of a semiconductor substrate and includes a predetermined number of word lines placed parallel to the horizontal direction as viewed from the drawing, a predetermined number of bits lines placed parallel to the direction orthogonal to the word lines, and a large number of two-layer gate structure type memory cells arranged in a lattice form at substantial intersections of these word and bit lines. The memory cells are group-divided into cell units with m+1 (e.g., 64) of $L_o$~$L_m$ disposed in the same column or array as units. Further, the cell units respectively constitute memory cell blocks with n+1 (e.g., 2048) of $C_o$~$C_n$ as units.

Further, the flash memory according to the embodiment 1 adopts a so-called hierarchical bit-line system. The bit lines employed in the memory array MARY comprise sub-bit lines commonly connected to drain regions of m+1 memory cells which constitute the respective cell units, and main bit lines to which a plurality of sub-bit lines are connected. Source regions of the m+1 memory cells, which constitute the respective cell units of the memory array MARY are connected in common to their corresponding local source lines. These local source lines are connected to a common source line. Control gate electrodes of n+1 memory cells disposed in the same row of each memory block are commonly connected to their corresponding word lines.

Figure 2:
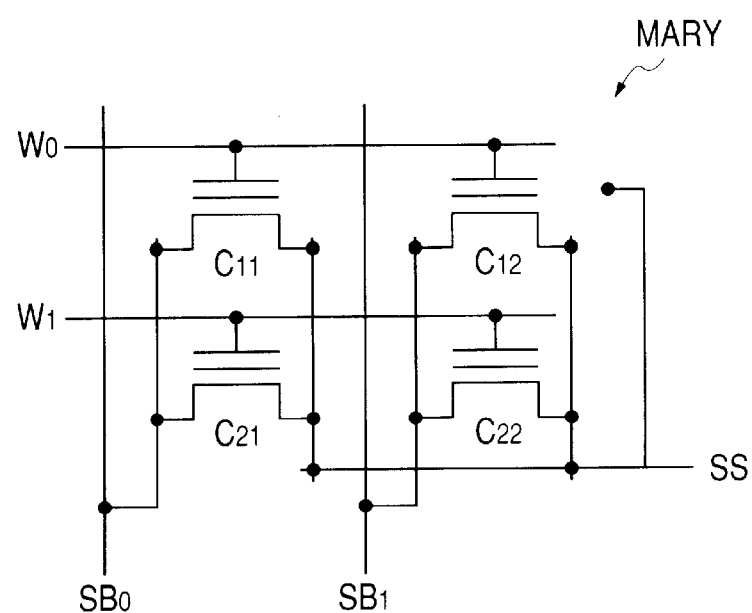
FIG. 2 is a partly equivalent circuit diagram showing a memory array included in the flash memory shown in FIG. 1.

Next, a partial equivalent circuit of the memory array MARY included in the flash memory shown in FIG. 1 is typically shown in FIG. 2. A specific configuration of the memory array of the NOR type flash memory and a method of operating the same will be explained based on the same drawing. Incidentally, while FIG. 2 shows memory cells corresponding to 4 bits, which are brought to an array configuration by using two word lines and two bit lines, the number of the memory cells and the numbers of the word lines and bit lines are respectively not limited to the above.

In the memory array MARY as shown in FIG. 2, control gate electrodes of memory cells $C_{11}$ and $C_{12}$ are respectively connected to a word line $W_0$, control gate electrodes of memory cells $C_{21}$ and $C_{22}$ are connected to a word line $W_1$, drain regions of the memory cells $C_{11}$ and $C_{21}$ are connected to a sub-bit line $SB_0$, and drain regions of the memory cells $C_{12}$ and $C_{22}$ are connected to a sub-bit line $SB_1$. Further, source regions of the memory cells $C_{11}$, $C_{12}$, $C_{21}$ and $C_{22}$ are connected to a local source line SS.

A description will next be made of the operation of writing of data into the memory cell $C_{11}$ having an NMOS structure, the operation of erasing of the data therefrom and the operation of reading of the data therefrom. Upon the writing of the data therein, a relatively high positive voltage, e.g., 10 V is applied to the selected word line $W_0$, and a relatively high voltage, e.g., 6 V is applied to the sub-bit line $SB_0$. Further, the sub-bit line $SB_1$, local source line SS and substrate (well in the case of a structure having the well) are set to 0 V. Thus, in the selected memory cell $C_{11}$, a floating gate electrode thereof is negatively charged under the injection of HE according to the above-described principle, and the threshold voltage thereof as viewed from the control gate electrode thereof is brought to a predetermined value, e.g., it ranges from 4 V to 5 V, i.e., it results in a data-written state, e.g., a logic "0". Incidentally, while a positive voltage is applied even to the drain region of the non-selected memory cell $C_{21}$, a leak current developed in the non-selected memory cell $C_{21}$ is suppressed under the application of a negative voltage, e.g., –2.5 V to the non-selected word line $W_1$.

In a state in which the sub-bit lines $SB_0$ and $SB_1$ and the local source line SS are kept open upon the erasing of the data from the memory cell $C_{11}$, a relatively high positive voltage, e.g., 10 V is applied to the word lines $W_0$ and $W_1$, and a relatively high negative voltage, e.g., –11 V is applied to the substrate. Thus, since the potential of the floating gate electrode is returned to neutrality due to tunnel emission wherein electrons in the floating gate electrode are pulled out to the substrate, the threshold voltage as viewed from the control gate electrode is brought to a predetermined value, e.g., it ranges from 0 V to 1.5 V, i.e., it results in a data-erased state, e.g., a logic "1". While the erasing of the data herein has been effected on all the memory cells connected to the word lines $W_0$ and $W_1$ collectively and simultaneously, the data may be erased in word-line units.

Upon the reading of the data from the memory cell $C_{11}$, a positive voltage, e.g., a voltage of 3.8 V is applied to the selected word line $W_0$, and a positive voltage, e.g., 1.0 V is applied to the sub-bit line $SB_0$. Further, 0 V is applied to the non-selected word line $W_1$, the local source line SS and the substrate, and the sub-bit line $SB_1$ is brought to an open state. When the data is in the state of being erased from the memory cell at this time, the threshold voltage is low and a current flows into a channel region, so that the potential at the sub-bit line $SB_0$ is reduced. However, since the threshold voltage is high and no current flows into the channel region when the data is in the state of being written into the memory cell, the voltage at the sub-bit line SB$_0$ is kept at 1.0 V. Therefore, the sub-bit line voltage is detected for each sub-bit line to allow the reading of information from the corresponding memory cell.

Figure 3:
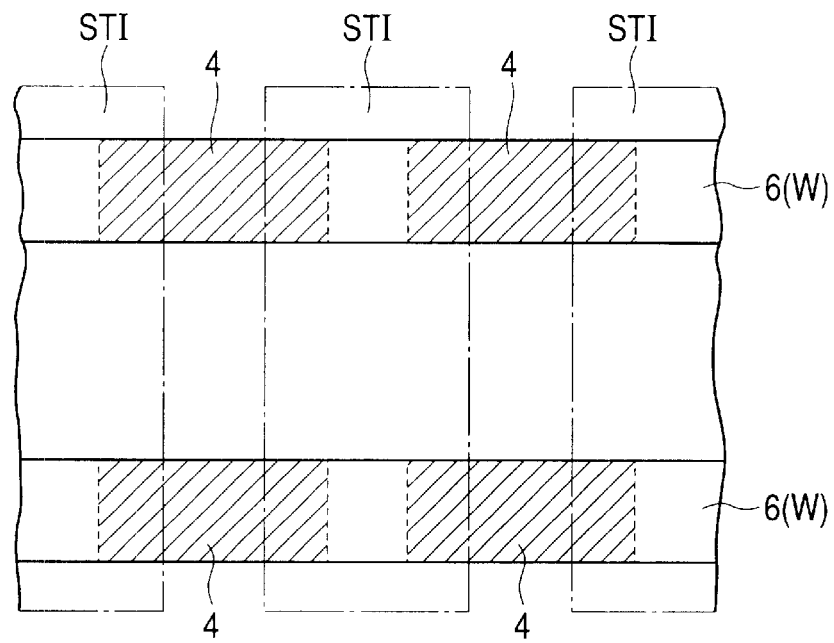
FIG. 3 is a fragmentary plan view of the memory array shown in FIG. 2.
Figure 4:
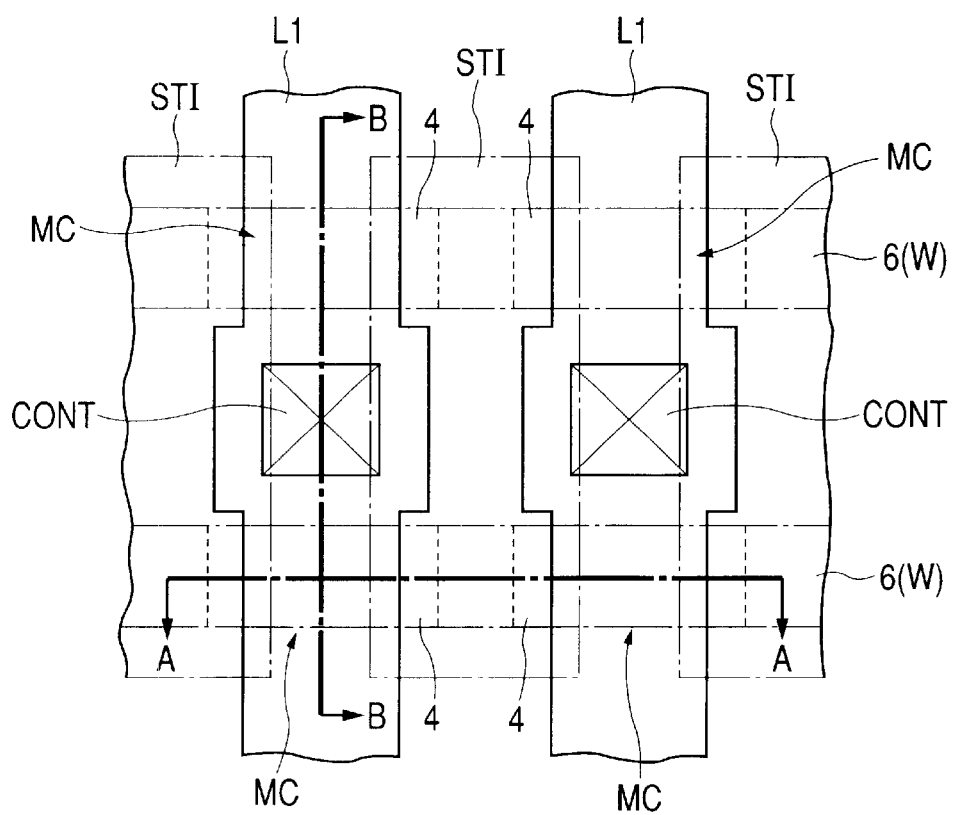
FIG. 4 shows the same plan area as FIG. 3 and is a fragmentary plan view added with a layout layer provided above as viewed from FIG. 3.
Figure 5:
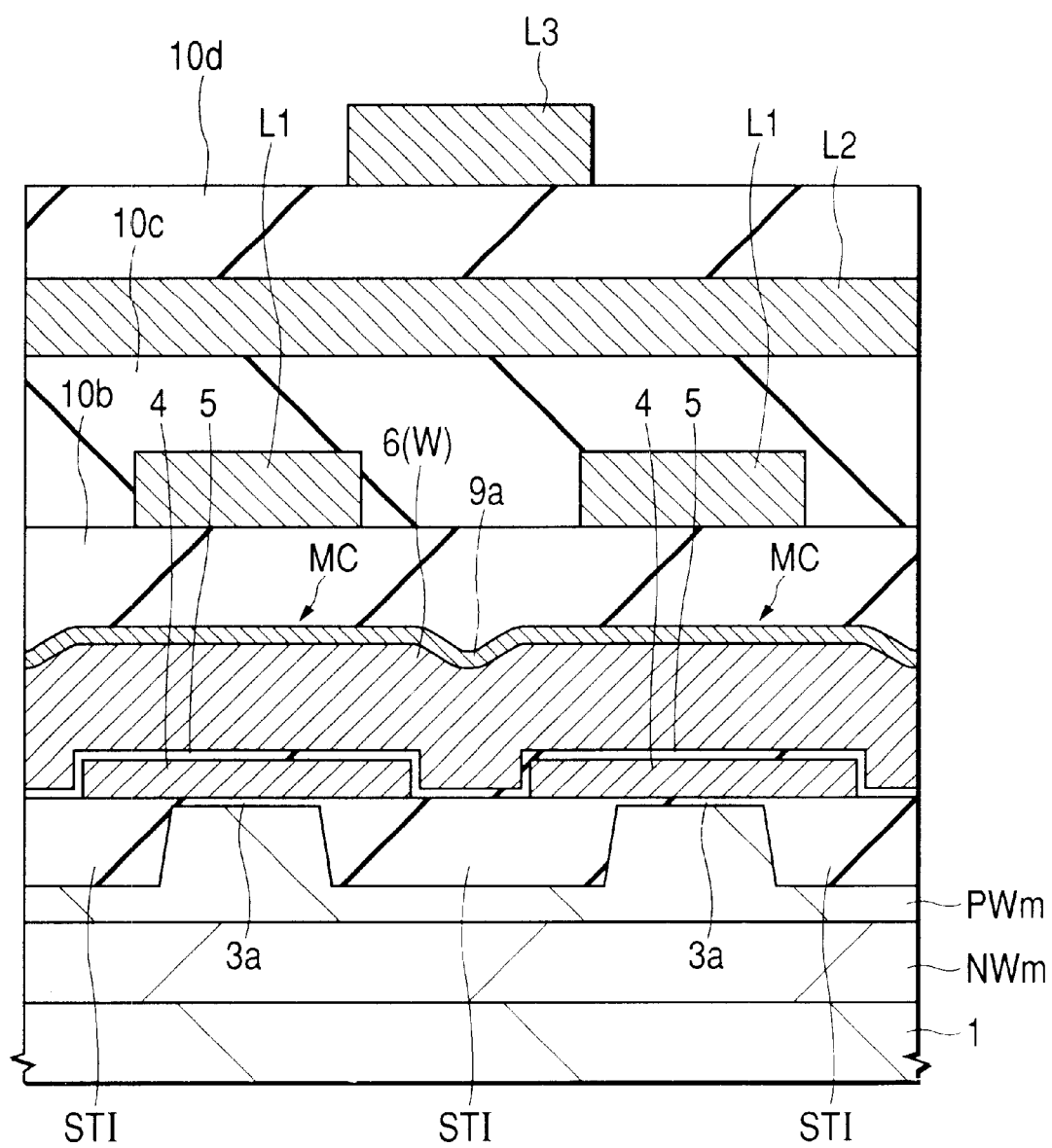
FIG. 5 is a cross-sectional view taken along line A—A of FIG. 4.
Figure 6:
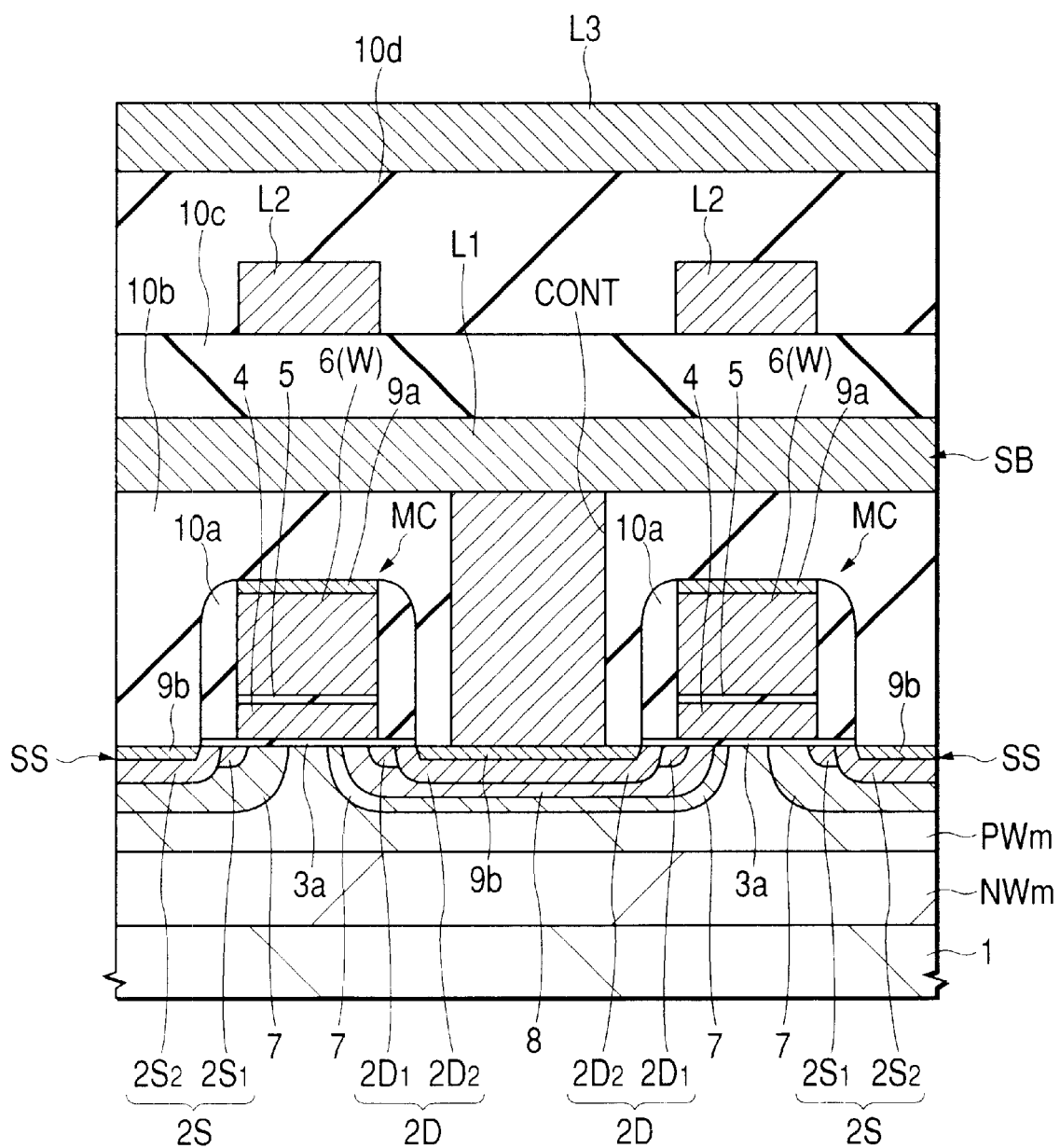
FIG. 6 is a cross-sectional view taken along line B—B of FIG. 4.
Figure 7:
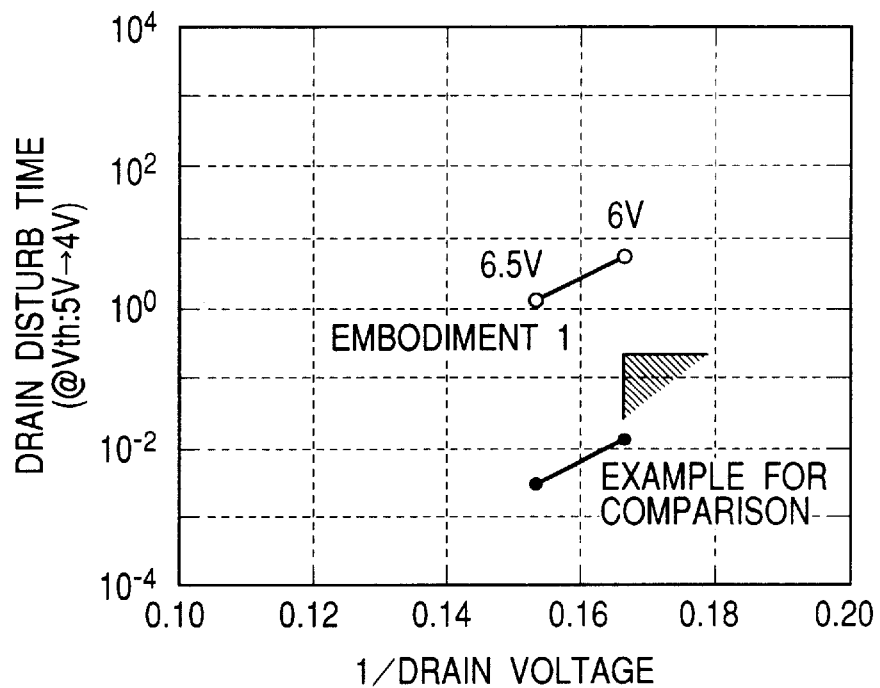
FIG. 7 is a graph showing one example of a drain disturb characteristic of each non-selected memory cell.
Figure 8:
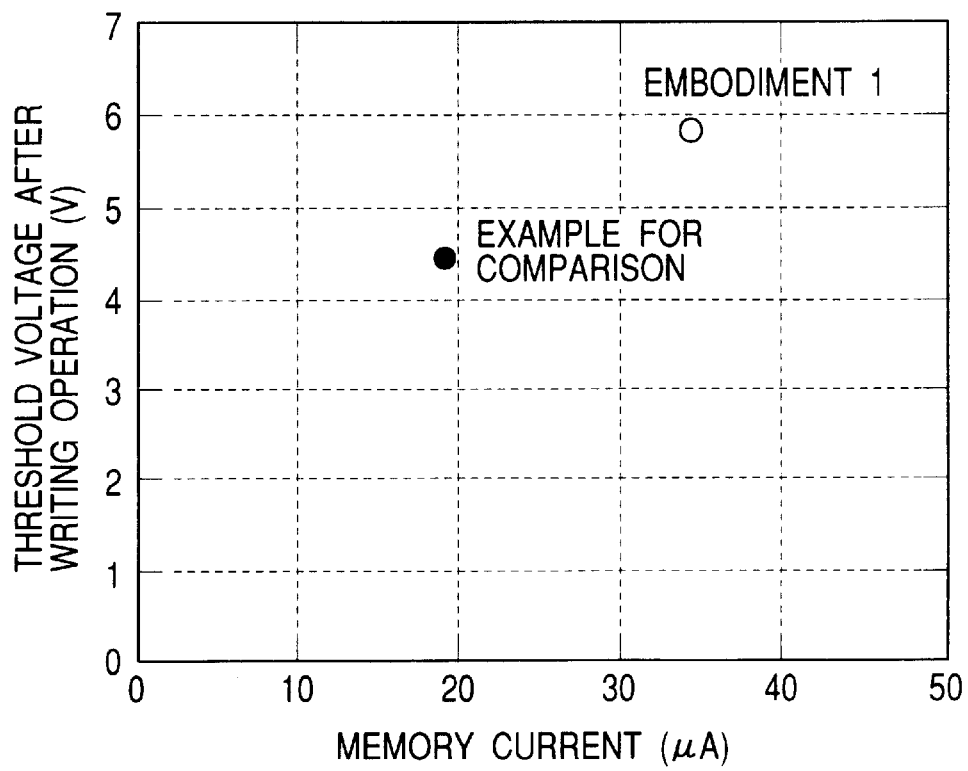
FIG. 8 is a graph showing threshold voltages after the writing of data into each memory cell and currents at the reading of data.

A device layout or arrangement of memory cells MC employed in the NOR type flash memory according to the embodiment 1 and a device structure thereof will next be described with reference to FIGS. 3 through 8. FIG. 3 is a fragmentary plan view of the memory array MARY, FIG. 4 is the same plane area as FIG. 3 and is a fragmentary plan view further added with a layout layer located above FIG. 3, FIG. 5 is a cross-sectional view taken along line A—A (corresponding to a line obtained by cutting a word line along its extending direction over the word line) of FIG. 4, and FIG. 6 is a cross-sectional view taken along line B—B (corresponding to a line obtained by cutting a channel region of each memory cell along the direction intersecting each word line) of FIG. 4, respectively. Incidentally, while the cross-sectional views shown in FIGS. 5 and 6 will be described centrally herein, occasional reference is made to FIGS. 3 and 4 as to points to be described in a planar configuration. Further, FIG. 7 is a graph showing one example of a drain disturb characteristic of each non-selected memory cell, and FIG. 8 is a graph showing threshold voltages after the writing of data into each memory cell and currents at the reading of the data therefrom, respectively.

A semiconductor substrate 1 comprises, for example, a p-type silicon monocrystal. A p well PWm of about $1 \times 10^{17}$ cm$^{-3}$, in which, for example, boron (B) is introduced into the semiconductor substrate 1, is formed over the semiconductor substrate 1. The p well PWm is taken or brought in a buried n well NWm formed therebelow and is electrically isolated from the semiconductor substrate 1. The buried n well NWm is formed by introducing, for example, phosphorus (P) or arsenic (As) into the semiconductor substrate 1 and has the function of restraining or preventing the intrusion of noise produced from other elements on the semiconductor substrate 1 into the p well PWm (i.e., each memory cell MC) through the semiconductor substrate 1, and setting the potential of the p well PWm to a predetermined value independently of the semiconductor substrate 1.

For example, trench isolations STI are defined in a main surface of the semiconductor substrate 1. An insulating film is embedded in trenches dug every intervals between adjacent respective columns of a plurality of memory cells MCs so as to electrically isolate the plurality of memory cells MCs to thereby form the trench isolations STI. The insulating film used for the trench isolations STI comprises, for example, silicon oxide or the like and is flattened so that its upper surface substantially coincides with the main surface of the semiconductor substrate 1.

Each of the memory cells MCs has a pair of n type semiconductor regions 2S and 2D formed over the semiconductor substrate 1 with the channel region interposed therebetween, a gate insulating film 3a formed over the main surface (active region) of the semiconductor substrate 1, a conductor or conductive film 4 (indicated by hatching in FIG. 3) for a floating gate electrode thereof, which is formed on the gate insulating film 3a, an interlayer film 5 formed on the conductor film 4, and a conductor film 6 for a control gate electrode thereof, which is formed on the interlayer film 5.

The n type semiconductor region 2D of the memory cell MC is a region for forming a pair of drain regions adjacent to each other. The n type semiconductor region 2D is formed to a predetermined depth from the main surface of the semiconductor substrate 1 in an area surrounded by the trench isolations STI and the conductor film 4 and is electrically connected to part of a sub-bit line SB. Further, the n type semiconductor region 2D comprises an n$^+$-type semiconductor region 2D$_1$ and an n$^{++}$-type semiconductor region 2D$_2$ substantially higher than the n$^+$-type semiconductor region 2D$_2$ in impurity concentration. The n$^+$-type semiconductor region 2D$_1$ extends up to a portion below the conductor film 4 for the floating gate electrode.

The n type semiconductor region 2S of the memory cell MC is a region for forming a source region. The n type semiconductor region 2S is formed to a predetermined depth as viewed from the main surface of the semiconductor substrate 1 in an area outside each of the conductor films 4 interposing the n type semiconductor regions 2D therebetween and comprises part of a common n type semiconductor region extending along the source side of each word line 6 (W). The common semiconductor region constitutes a local source line SS. The n type semiconductor region 2S comprises an n$^+$-type semiconductor regions 2S1, and an n$^{++}$-type semiconductor region 2S$_2$ substantially higher than the n$^+$-type semiconductor region 2S$_1$ in impurity concentration. Incidentally, the sub-bit line SB is electrically connected to a main bit line formed of a metal film or the like, and the local source line SS made up of the common semiconductor region is electrically connected to a common source line formed of a metal film or the like. The n$^+$-type semiconductor region 2S$_1$ extends up to a portion below the conductor film 4 for the floating gate electrode.

Further, the n type semiconductor regions 2S and 2D are substantially higher than the channel region in impurity concentration and are respectively surrounded by punch-through stopper layers 7 each of which comprises a p-type impurity. Forming the punch-through stopper layers 7 on both sides of the source and drain regions in this way allows the prevention of a short channel effect of each memory cell MC whose gate length is 0.3 μm or less (First effect). When, for example, boron of about $5 \times 10^{12}$ cm$^{-2}$ is ion-implanted in both sides of the source and drain regions to thereby form the punch-through stopper layer 7, a minimum gate-length size free of the generation of punch-through results in about 0.22 μm.

Further, the formation of the punch-through stopper layers 7 on both sides of the source and drain regions also provides the effect of reducing variations in current at data reading (Second effect). When, for example, boron of about $5 \times 10^{12}$ cm$^{-2}$ is ion-implanted in both sides of the source and drain regions to form the punch-through stopper layers 7, a variation in current at data reading results in about ½ or less, i.e., about 2.2 μA/σ as compared with the non-formation of the punch-through stopper layers 7.

Further, an n-type semiconductor region 8 substantially lower than the n$^+$-type semiconductor region 2D$_1$ in impurity concentration is provided between the n type semiconductor region 2D and the punch-through stopper layer 7 which constitute the drain region. The n$^-$-type semiconductor region 8 relaxes an electric field at a junction portion of the punch-through stopper layer 7. Thus, even if the punch-through stopper layers 7 each having the function of preventing a short channel effect are provided and a negative voltage is applied to the control gate electrode of each non-selected memory cell to reduce a leak current of the non-selected memory cell upon writing, a drain disturb phenomenon can be prevented from occurring (Third effect). Namely, since electron-hole pair dissociation produced due to an avalanche breakdown decreases with the relaxation of the electric field at a drain end, hot holes injected into the floating gate electrode decrease even if a negative voltage is applied to the control gate electrode of each non-selected memory cell upon writing, whereby a variation in threshold voltage is suppressed. Namely, the punch-through stopper layers 7 and the n⁻-type semiconductor region 8 extend to the portion below the conductor film 4 for the floating gate electrode.

FIG. 7 is a graph showing one example of a drain disturb characteristic of each non-selected memory cell employed in the present embodiment 1. The vertical axis thereof indicates an information holding time necessary for the threshold voltage of the non-selected memory cell to decrease from 5 V to 4 V after the completion of a write operation. The horizontal axis thereof indicates an inverse number of a drain voltage. FIG. 7 shows a drain disturb characteristic of a non-selected memory cell provided with a drain region surrounded by a punch-through stopper layer 7 unformed with the n⁻-type semiconductor region 8 as an example for comparison. In the drawing, one example of the required information holding time is indicated by a hatched area. It was necessary to set a drain voltage as 6 V and provide an information holding time of $2 \times 10^{-2}$ seconds or more herein. While only an information holding time of about $10^{-2}$ seconds is obtained at the drain voltage of 6 V in the non-selected memory cell employed in the example for the comparison, the information holding time of each non-selected memory cell employed in the embodiment 1 is about $5 \times 10^{0}$ seconds, and hence an information holding time, which is longer by an order of magnitude or more than the required information holding time, is obtained.

Further, the provision of the punch-through stopper layer 7 and the n⁻-type semiconductor region 8 below the floating gate electrode makes it possible to improve the efficiency of writing of data into each memory cell MC (the efficiency of injection of HE) (Fourth effect). Namely, since the channel region to which an electric field lying in a channel horizontal direction is applied, becomes wide while the peak value of the electric field lying in the channel horizontal direction decreases due to the provision of the n⁻-type semiconductor region 8, the number of electrons accelerated until they have energy necessary for the injection of HE, increases, and the efficiency of injection of HE is improved.

Further, since the n⁻-type semiconductor region 8 cancels the punch-through stopper layer 7 at the drain end in the surface of the p well PWm, it is possible to prevent a reduction in the degree of motion of carriers at the drain end and increase a current at data reading (Fifth effect). Since the increase in the current at the data reading speeds up a reduction in the potential at each bit line at the data reading, the time required up to the determination of data can be shortened.

FIG. 8 shows threshold voltages after the writing of data into each of the memory cells employed in the embodiment 1 and currents at the reading of the data therefrom. FIG. 8 illustrates characteristics of a memory cell provided with a drain region surrounded by a punch-through stopper layer 7 unformed with an n⁻-type semiconductor region 8 as an example for comparison. A threshold voltage subsequent to the writing of the data into the memory cell employed in the present embodiment 1 is about 5.8 V and increases by about 1.5 V as compared with the threshold voltage of the memory cell employed in the comparative example. Further, a read current used for the memory cell employed in the present embodiment 1 is about 34 μA and increases by about 15 μA as compared with the read current used for the memory cell employed in the comparative example.

The gate insulating film 3a, which constitutes each memory cell MC, comprises silicon oxide or the like whose thickness ranges from about 9 mm to about 11 mm, for example and serves as an electron pass-through area (tunnel insulating film) when electrons that contribute to the formation of information, are injected from the semiconductor substrate 1 to the conductor film 4 for the floating gate electrode or the electrons held by the conductor film 4 are discharged to the semiconductor substrate 1. Incidentally, the gate length of each memory cell MC is about 0.3 μm, for example, and the gate width thereof is about 0.3 μm.

The conductor film 4 for the floating gate electrode comprises low-resistance polycrystalline silicon with, for example, an n type impurity introduced therein. The thickness of the conductor film 4 is about 100 nm. Further, the surface of the conductor film 4 for the floating gate electrode is covered with the interlayer film 5, whereby the conductor film 4 for the floating gate electrode is isolated from the conductor film 6 for the control gate electrode. The interlayer film 5 is formed by stacking a silicon oxide film on, for example, a silicon oxide film with a silicon nitride film interposed therebetween, and the thickness thereof is about 20 nm, for example.

The conductor films 6 for the control gate electrodes are electrodes for reading, writing and erasing information and comprise parts of word lines W, respectively. The word lines W are formed in band-like patterns extending in the gate-width direction and are placed side by side in plural form in parallel along the gate-width direction. Each conductor film 6 for the control gate electrode comprises low-resistance polycrystalline silicon having a thickness of about 200 nm, for example. A cobalt silicide ($CoSi_x$) film 9a having a thickness of about 30 nm, for example, is formed over the conductor film 6 by a self-aligned technology. Since the electrical resistance of each word line W can be reduced owing to the provision of the cobalt silicide film 9a, the operating speed of the flash memory can be enhanced. However, the structure of the conductor film 6 is not limited to the above and can be changed in various ways. For example, it may adopt a structure wherein a metal film like tungsten or the like is stacked on low-resistance polycrystalline silicon with a barrier conductor film like tungsten nitride or the like interposed therebetween. Since the electrical resistance of the word line W can significantly be reduced, the operating speed of the flash memory can further be improved.

Further, an insulating film 10a formed of, for example, silicon oxide covers each of both sides of such conductor films 4 and 6 as described above. An insulating film 10b formed of, for example, silicon oxide, is deposited on such an insulating film 10a and a cobalt silicide film 9a.

Each of first layer wirings L1 formed of, for example, tungsten or the like is formed on the insulating film 10b. A predetermined first layer wiring L1 is electrically connected to its corresponding n-type semiconductor region 2D of the memory cell MC through a contact hole CONT defined in the insulating film 10b. A cobalt silicide film 9b formed according to the same process as the cobalt silicide film 9a is formed on the surface of the n-type semiconductor region 2D, whereby the resistance of contact between the cobalt silicide film 9b and the first layer wiring L1 can be reduced.

Further, an insulating film 10c formed of, for example, silicon oxide, is deposited on the first layer wiring L1, whereby the surface of the first layer wiring L1 is covered therewith. Each of second layer wirings L2 is formed on the insulating film 10c. The second layer wiring L2 is formed by stacking titanium nitride, aluminum and titanium nitride on one another in order from below and electrically connected to its corresponding first layer wiring L1 via a through hole defined in the insulating film 10c. The surface of the second layer wiring L2 is covered with an insulating film 10d formed of silicon oxide, for example. A third layer wiring L3 is formed on its corresponding insulating film 10d. Further, a passivation film is formed over each wiring above the third layer wiring L3 and each wiring lying in the top layer as viewed from the third layer wiring L3. However, the illustration thereof is omitted.

One example of a method of manufacturing the flash memory according to the embodiment 1 will next be described in process order with reference to FIGS. 9 through 25. These drawings show fragmentary cross-sectional views including the memory array MARY, and the area for the peripheral circuits such as the control circuit CC, the decoder XD, etc., which are equivalent to the section taken along line B—B of FIG. 4. NMOSs and PMOSs illustrated in the peripheral circuit area are relatively low-voltage MOSs whose drive voltages range from about 1.8 V to about 3.3 V, for example.

Figure 9:
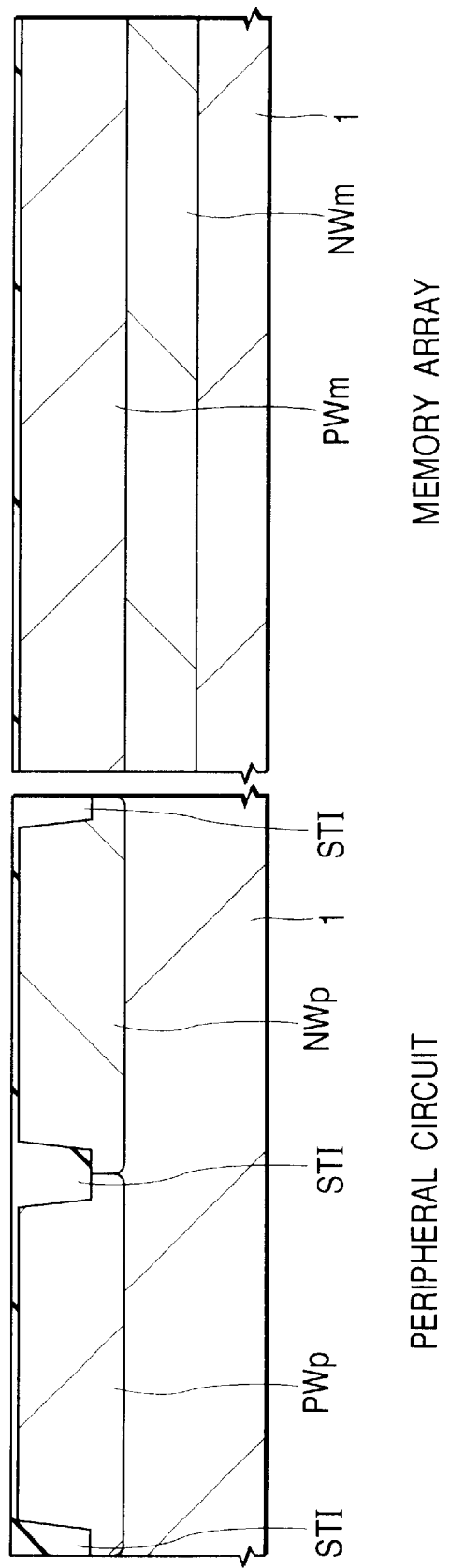
FIG. 9 is a fragmentary cross-sectional view of a semiconductor substrate showing one example of a method of manufacturing the flash memory according to one embodiment of the present invention in process order.

As shown in FIG. 9, for example, trench isolations STI and active regions or the like disposed so as to be surrounded thereby are first formed on a main surface of a semiconductor substrate (corresponding to a thin plate of a plane and substantially-circular semiconductor called a semiconductor wafer in this stage) 1. Namely, isolation trenches are defined in predetermined points of the semiconductor substrate 1. Thereafter, an insulating film comprising silicon oxide, for example, is deposited on the main surface of the semiconductor substrate 1 and further ground by a CMP (Chemical Mechanical Polishing) method or the like so as to remain only within the isolation trenches, whereby the trench isolations STI are formed.

Subsequently, a predetermined impurity is selectively introduced into a predetermined portion of the semiconductor substrate 1 with predetermined energy by an ion implantation method or the like to thereby form a buried n well NWm, a buried p well PWm, a buried p well PWp and a buried n well NWp.

Next, as shown in FIG. 10(A), a relatively thin gage insulator 3a having a thickness, which ranges from about 9 nm to about 11 nm, for example, is formed on the main surface of the semiconductor substrate 1 by a thermal oxidation method or the like. Thereafter, a conductor film 4 formed of low-resistance polycrystalline silicon indicative of n type conductivity, which has a thickness of, for example, about 100 nm, is deposited on the main surface of the semiconductor substrate 1 by a CVD (Chemical Vapor Deposition) method or the like. Subsequently, such a photoresist pattern PR1 as to expose the conductor films 4 on memory array isolations STI is formed to pattern floating gate electrodes as viewed in a word-line extending direction, followed by removal of the conductor films 4 exposed from the photoresist pattern PR1 with the photoresist pattern PR1 as an etching mask. Next, an interlayer film 5 is formed on the main surface of the semiconductor substrate 1. The interlayer film 5 is a stacked film obtained by depositing a silicon oxide film, a silicon nitride film and a silicon oxide film in order from below by the CVD method or the like. The thickness of the interlayer film 5 is about 20 mm, for example.

Figure 11:
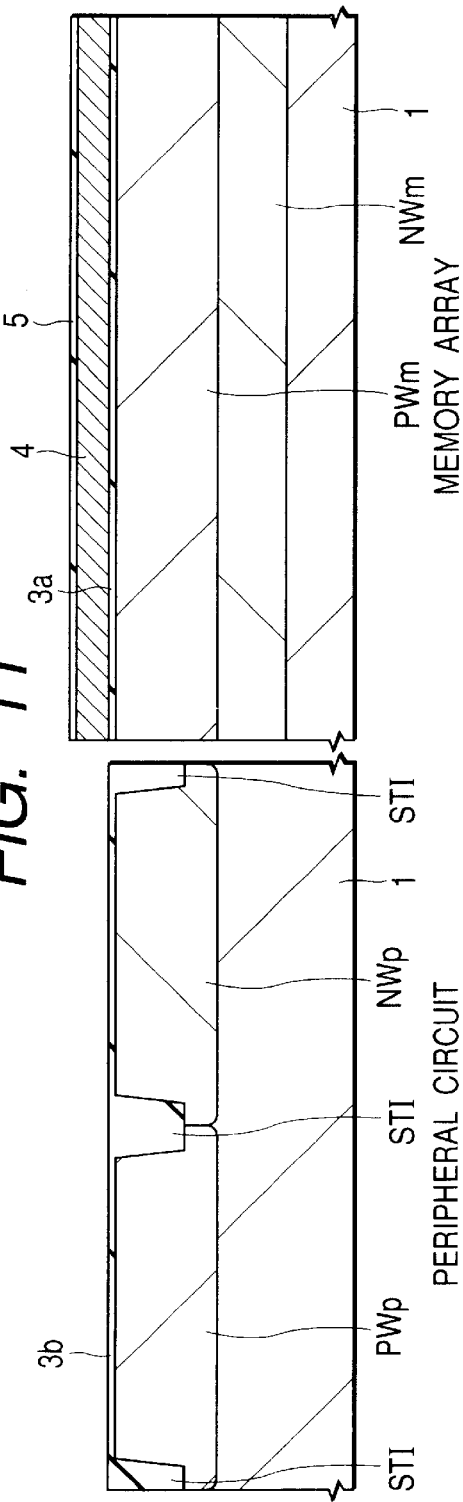
FIG. 11 is a fragmentary cross-sectional view of the semiconductor substrate showing one example of the method of manufacturing the flash memory according to one embodiment of the present invention in process order.

Next, as shown in FIG. 11, such a photoresist pattern as to cover the memory array and expose the peripheral circuit area other than the memory array is formed. Thereafter, the interlayer film 5 and the gate insulating film 3a exposed from the photoresist pattern are removed by etching with the photoresist pattern as an etching mask. Next, the photoresist pattern is removed, followed by thermal oxidation processing of the semiconductor substrate 1, thereby forming a gate insulating film 3b having a thickness which ranges from about 4 nm to about 8 nm, for example in the peripheral circuit area.

Next, an amorphous silicon film (not shown) having a thickness of, for example, about 200 nm is deposited over the semiconductor substrate 1 by the CVD method. Thereafter, an n type impurity, e.g., phosphor is ion-implanted in the amorphous silicon film in each of NMOS forming areas for the memory array and each peripheral circuit, and a p type impurity, e.g., boron is ion-implanted in a PMOS forming area for each peripheral circuit.

Figure 12:
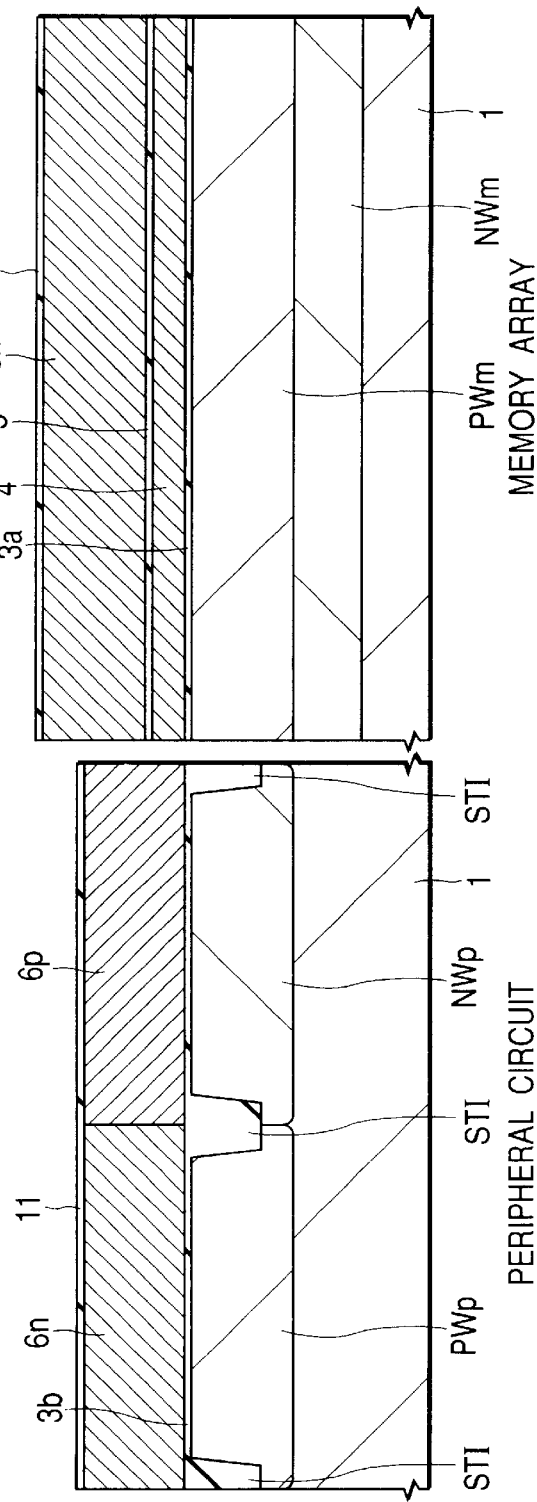
FIG. 12 is a fragmentary cross-sectional view of the semiconductor substrate illustrating one example of the method of manufacturing the flash memory according to one embodiment of the present invention in process order.

Thereafter, the semiconductor substrate 1 is heat-treated at 950° for about 60 seconds as shown in FIG. 12 to activate the n type impurity and the p type impurity introduced in the amorphous silicon film and change the amorphous silicon film in each of the NMOS forming areas for the memory array and each peripheral circuit to a conductor film 6n formed of n type polycrystalline silicon and change the amorphous silicon film in the PMOS forming area for each peripheral circuit to a conductor film 6p formed of p type polycrystalline silicon. Further, an insulating film 11 is formed on the conductor films 6n and 6p.

Figure 13:
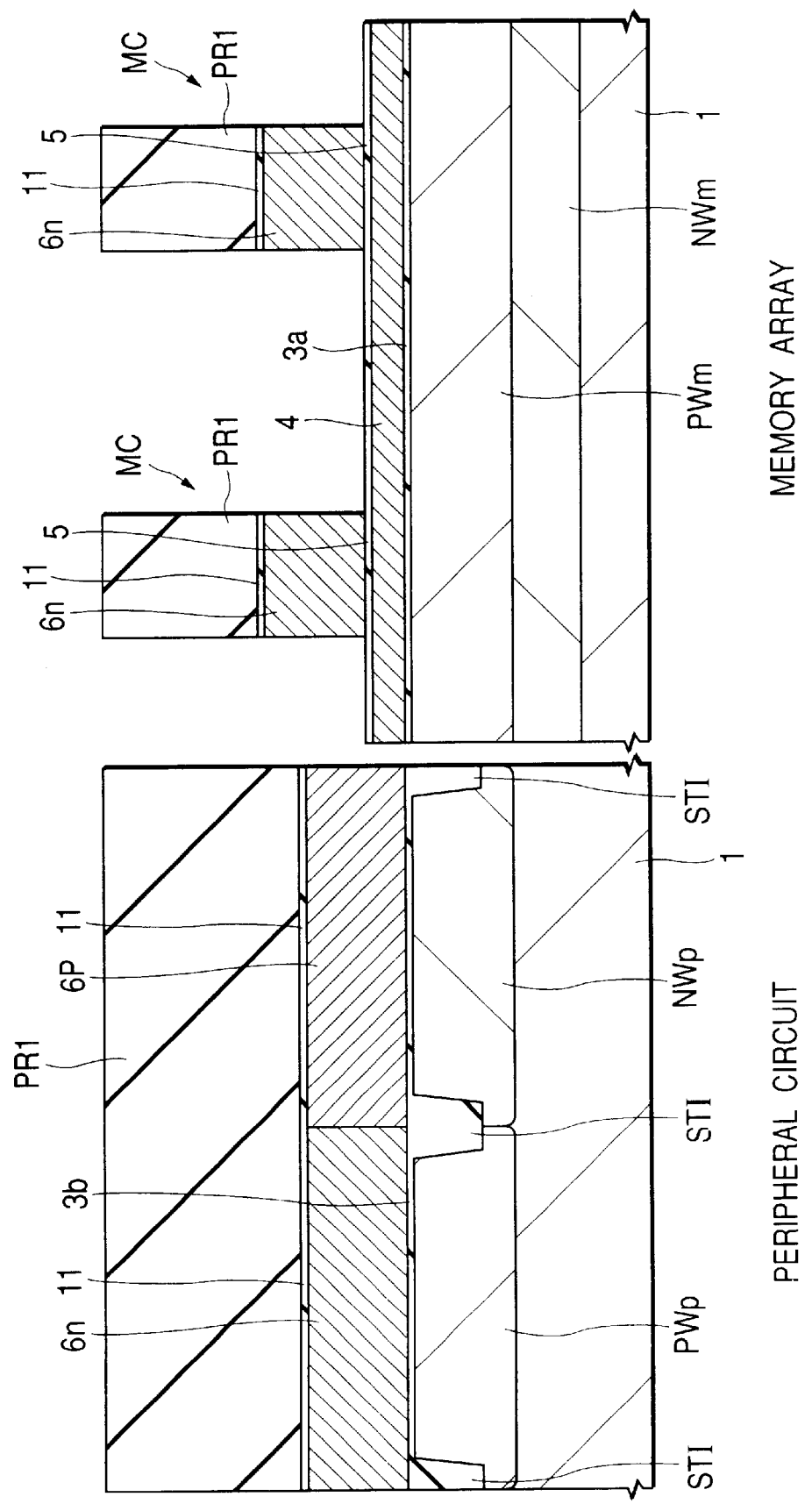
FIG. 13 is a fragmentary cross-sectional view of the semiconductor substrate depicting one example of the method of manufacturing the flash memory according to one embodiment of the present invention in process order.

Next, as shown in FIG. 13, a photoresist pattern PR2 is formed on the insulating film 11. The photoresist pattern PR2 is used as an etching mask and the insulating film 11 and conductor films 6n and 6p of the memory array, which are exposed from the photoresist pattern PR2, are successively removed by a dry etching method or the like. Consequently, control gate electrodes (word lines W) each formed of the conductor film 6n of the memory cell MC are formed in the memory array, and an NMOS gate formed of the conductor film 6n and a PMOS gate formed of the conductor film 6p are formed in the peripheral circuit area.

Figure 14:
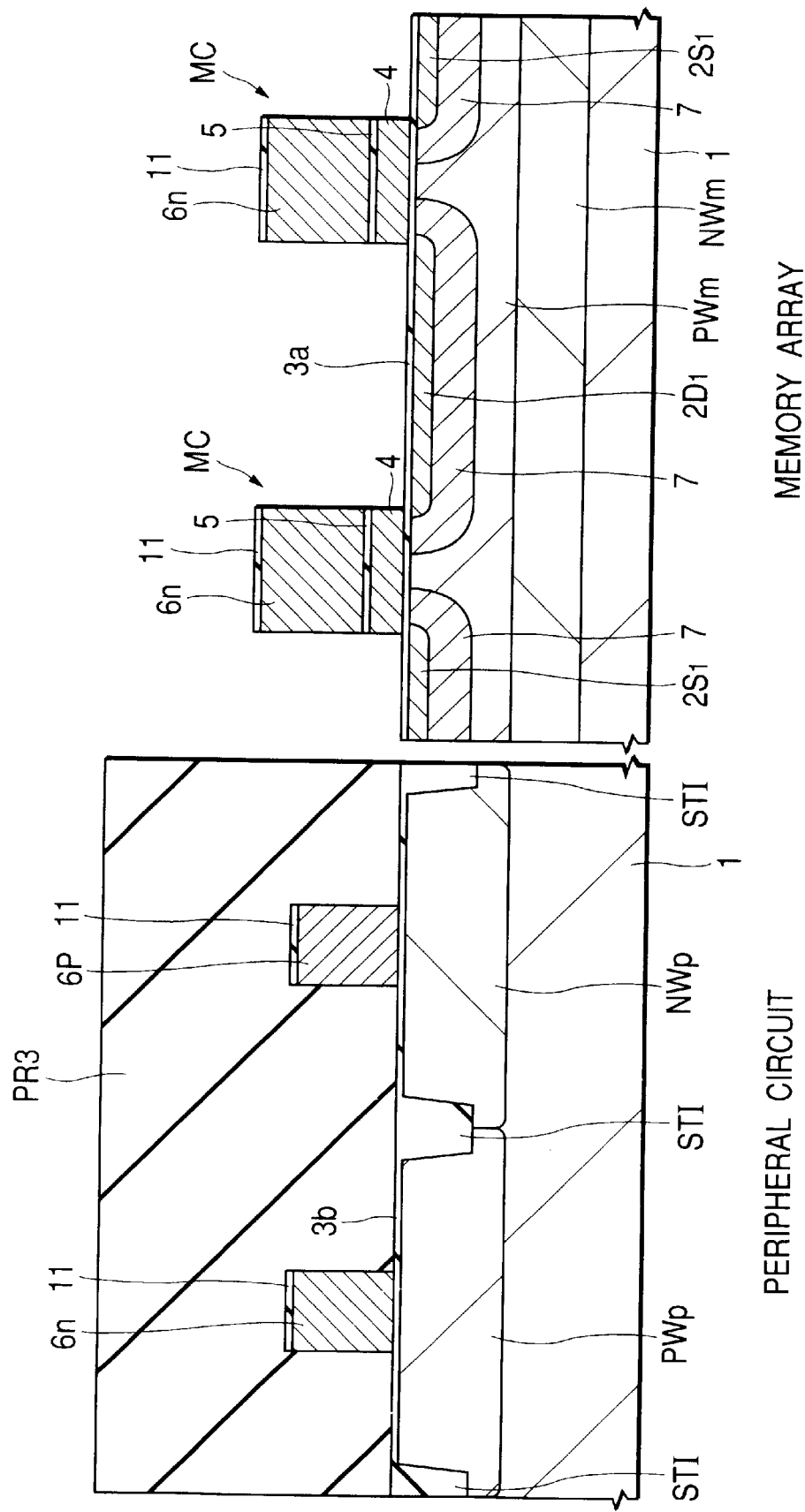
FIG. 14 is a fragmentary cross-sectional view of the semiconductor substrate showing one example of the method of manufacturing the flash memory according to one embodiment of the present invention in process order.

Next, as shown in FIG. 14, the peripheral circuit area is covered with a photoresist pattern PR3, and the interlayer film 5 and the conductor film 4 are patterned in a word-line width direction. Consequently, two-layer gate electrodes of each memory cell MC in the memory array are completed. Next, an n type impurity, e.g., arsenic is introduced into its corresponding p well PWm of the memory array by an ion implantation method or the like with the gates (control and floating gate electrodes) of the memory cell MC as masks, whereby n$^+$-type semiconductor regions 2S$_1$ and 2D$_1$, which constitute parts of the source and drain regions of the memory cell MC, are formed. The arsenic is injected therein in the form of an energy of 30 keV to be injected and a dose of 1×10$^{15}$ cm$^{-2}$, for example.

Subsequently, a p type impurity, e.g., boron is introduced into the p well PWm of the memory array by the ion implantation method or the like to thereby form punch-through stopper layers 7 (second semiconductor region and third semiconductor region) substantially higher than a channel region in impurity concentration, which surround the n$^+$-type semiconductor regions 2S$_1$ and 2D$_1$, and are diffused to below the floating gate electrodes. The boron is injected therein in the form of, for example, an energy of 40 keV to be injected and a dose of 2×10$^{13}$ cm$^{-3}$ at an angle made to the direction of the normal to the semiconductor substrate 1. In the present ion implantation process, the peripheral circuits are covered with the corresponding photoresist mask so as to avoid ion implantation.

Figure 15:
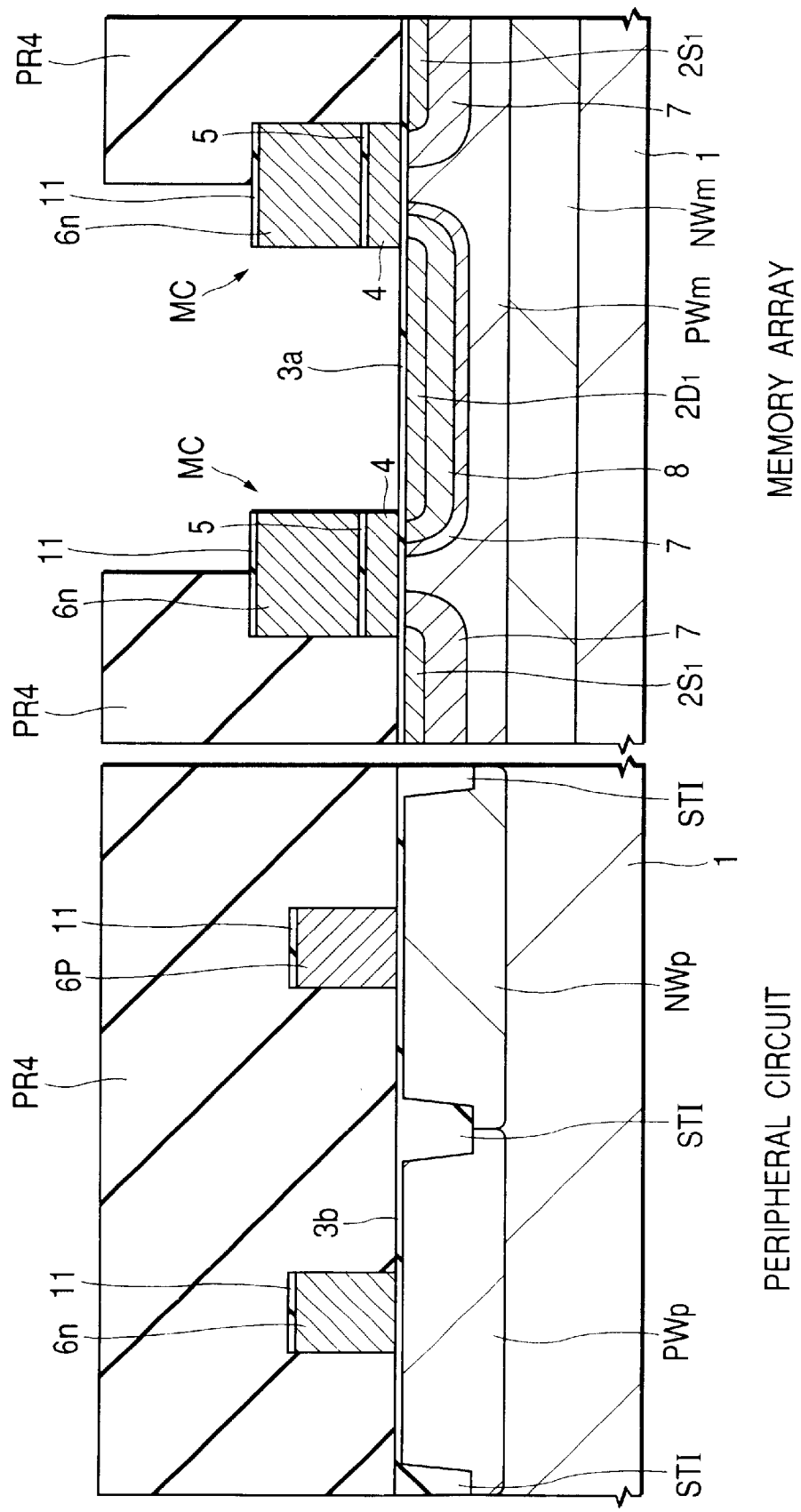
FIG. 15 is a fragmentary cross-sectional view of the semiconductor substrate illustrating one example of the method of manufacturing the flash memory according to one embodiment of the present invention in process order.

Next, as shown in FIG. 15, a photoresist pattern PR4 in which only the drain side of each memory cell MC is made open, is formed, and phosphorus corresponding to an n type impurity is introduced into its corresponding p well PWm of the memory array by the ion implantation method or the like with the gates (control and floating gate electrodes) of the memory cell MC as masks, whereby an n⁻-type semiconductor region (first semiconductor region) 8, which is diffused to below the floating gate electrode on the drain side and substantially lower than the n⁺-type semiconductor region 2D1 in impurity concentration, is formed. The phosphorus is injected therein in the form of an energy of 60 keV to be injected and a dose of $2\times10^{14}$ cm$^{-2}$, for example.

Figure 16:
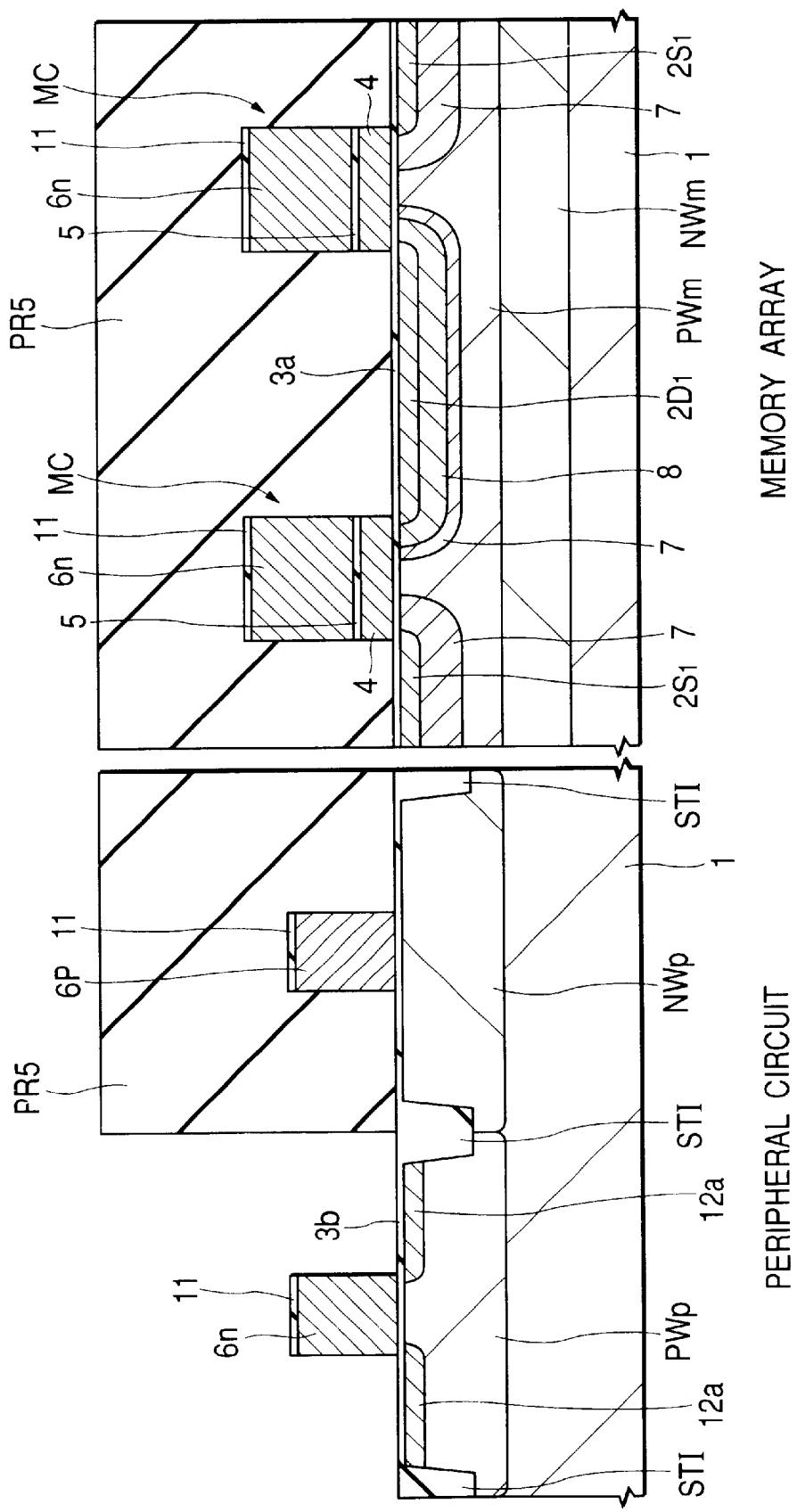
FIG. 16 is a fragmentary cross-sectional view of the semiconductor substrate depicting one example of the method of manufacturing the flash memory according to one embodiment of the present invention in process order.

Next, the photoresist patterns PR4 are removed. Thereafter, as shown in FIG. 16, the PMOS forming areas for the memory array and each peripheral circuit are covered with photoresist patterns PR5. Further, an n type impurity, e.g., phosphorus is introduced into its corresponding p well PWp for the peripheral circuit area by the ion implantation method or the like with the gate of each NMOS for the peripheral circuit as a mask to thereby form a pair of extended semiconductor regions 12a which constitutes parts of the source and drain regions of each NMOS. The phosphorus is injected therein in the form of, for example, an energy of 70 keV to be injected and a dose of $1\times10^{13}$ cm$^{-2}$.

Figure 17:
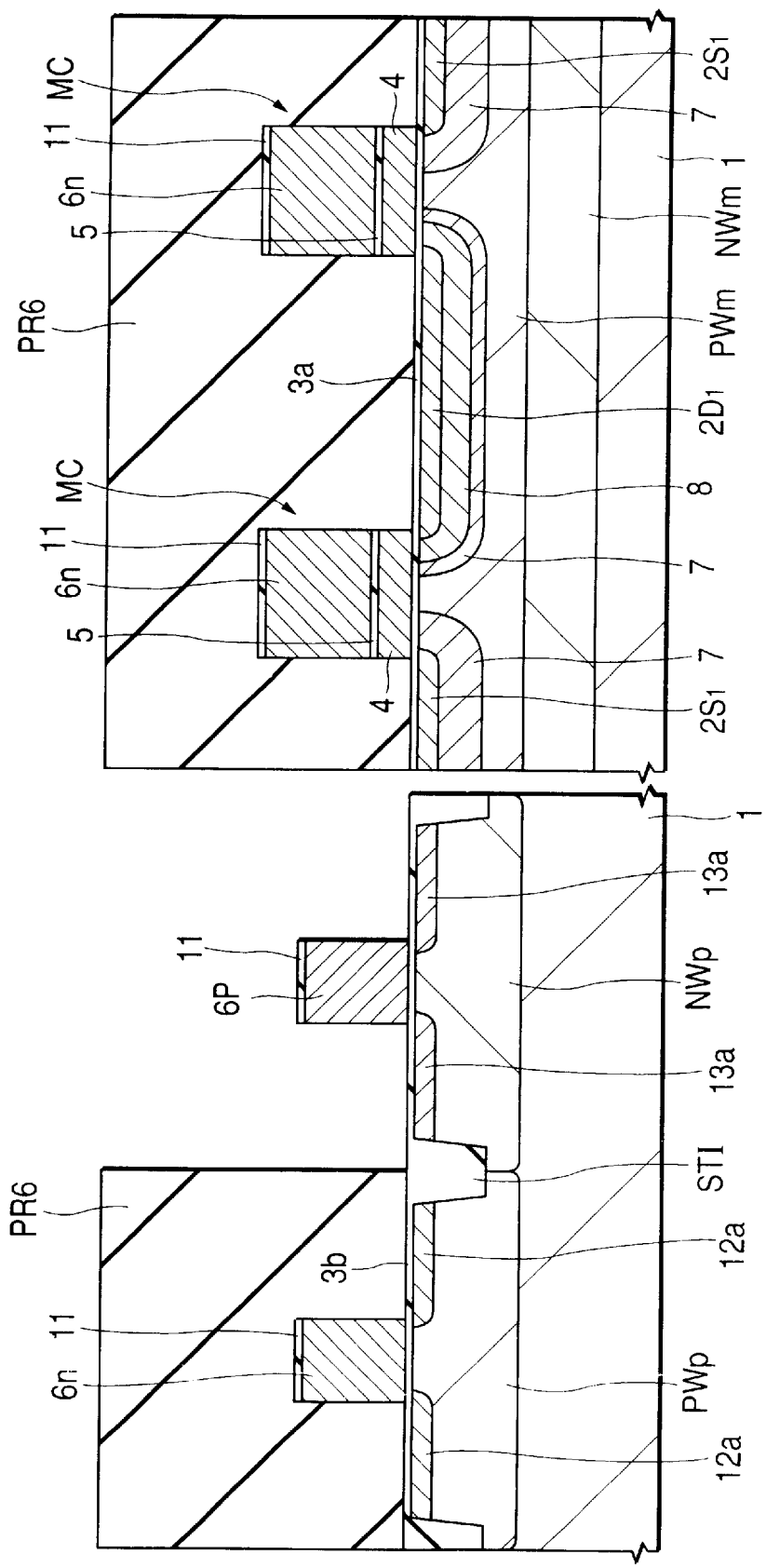
FIG. 17 is a fragmentary cross-sectional view of the semiconductor substrate showing one example of the method of manufacturing the flash memory according to one embodiment of the present invention in process order.

Similarly, the photoresist patterns PR5 are removed. Thereafter, as shown in FIG. 17, the NMOS forming areas for the memory array and each peripheral circuit are covered with photoresist patterns PR6. Further, an n type impurity, e.g., boron fluoride (BF$_2$) is introduced into its corresponding n well NWp in the peripheral circuit area by the ion implantation method or the like with the gate of each PMOS for the peripheral circuit as a mask to thereby form a pair of extended semiconductor regions 13a which constitutes parts of the source and drain regions of each PMOS. The boron fluoride is injected therein in the form of, for example, an energy of 70 keV to be injected and a dose of $1\times10^{13}$ cm$^{-2}$.

Figure 18:
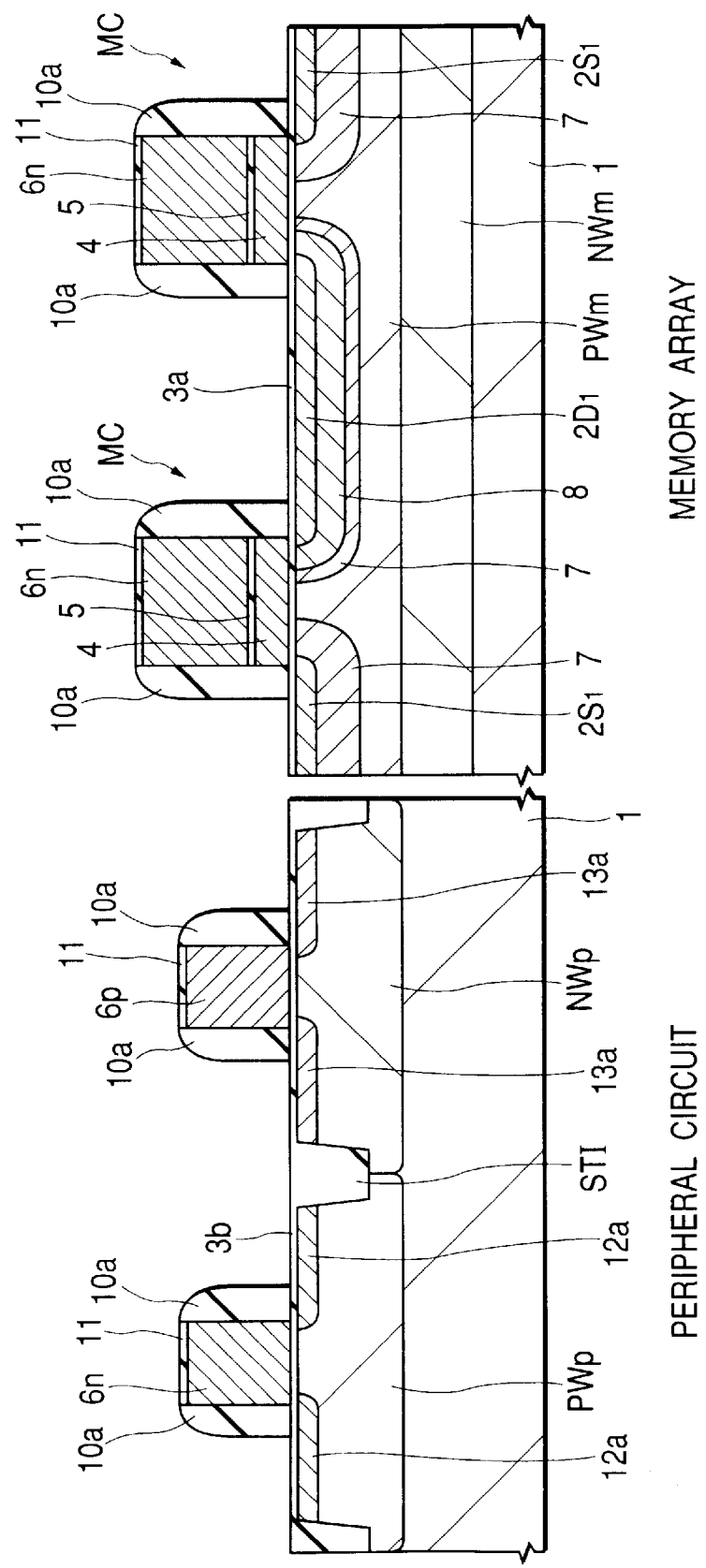
FIG. 18 is a fragmentary cross-sectional view of the semiconductor substrate illustrating one example of the method of manufacturing the flash memory according to one embodiment of the present invention in process order.

Next, the photoresist patterns PR6 are removed. Thereafter, as shown in FIG. 18, an insulating film comprising, for example, silicon oxide is deposited on the main surface of the semiconductor substrate 1 by the CVD method or the like, followed by etchback thereof by an anisotropic dry etching method or the like, whereby insulating films 10a are formed on their corresponding sides of the gates (control and floating gate electrodes) of the memory cells MC and the gates of the NMOS and PMOS for each peripheral circuit.

Figure 19:
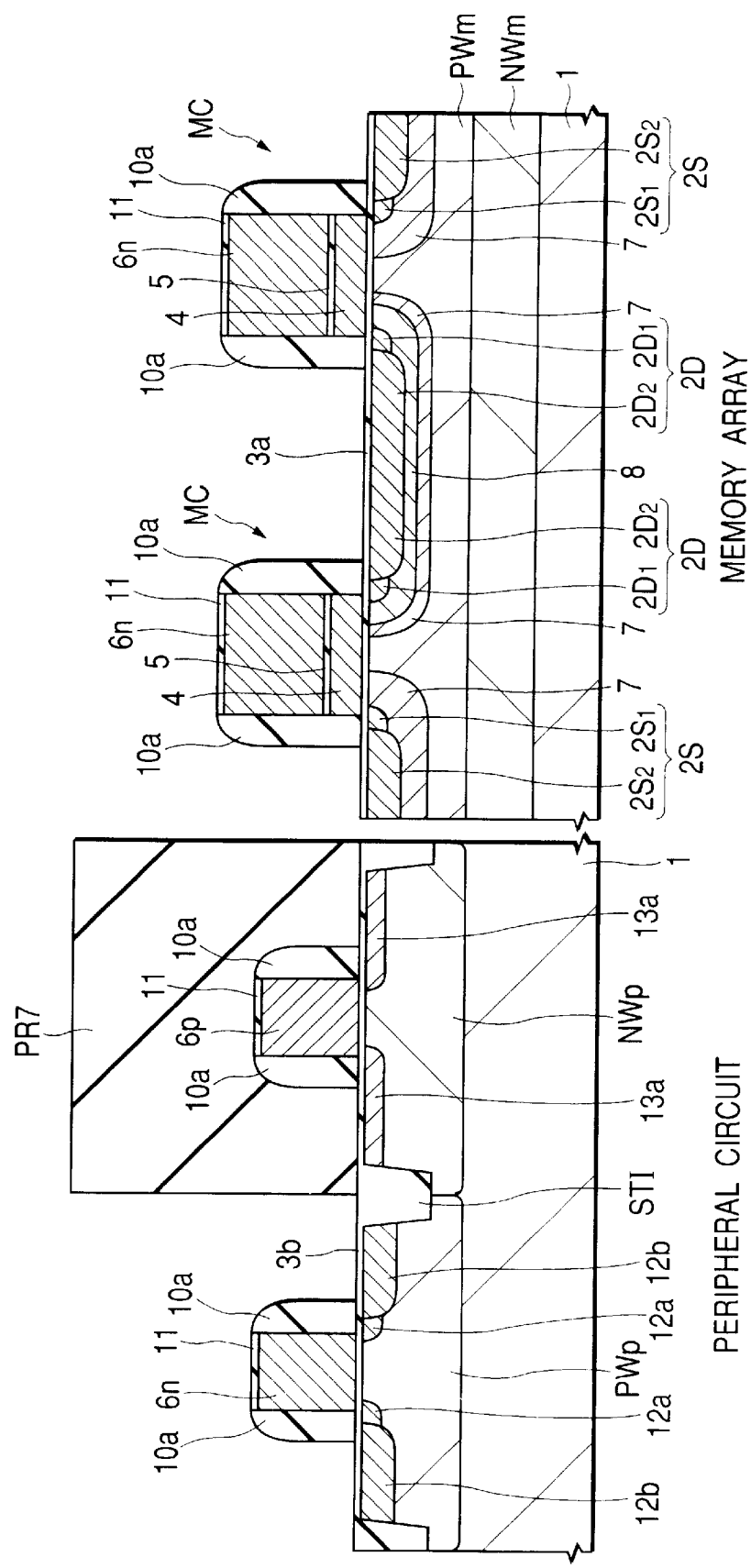
FIG. 19 is a fragmentary cross-sectional view of the semiconductor substrate depicting one example of the method of manufacturing the flash memory according to one embodiment of the present invention in process order.

Thereafter, as shown in FIG. 19, the PMOS forming area for the peripheral circuit is covered with a photoresist pattern PR7. The gates (control and floating gate electrodes) of the memory cells MC and their corresponding insulating films 10a, and the gates of NMOSs for the peripheral circuit and their corresponding insulating films 10a are used as masks, and an n type impurity, e.g., arsenic is ion-implanted in the p well PWm for the memory array and the p well PWp for the peripheral circuit area by the ion implantation method or the like to thereby form a pair of n⁺⁺-type semiconductor regions 2S$_2$ and 2D$_2$ which constitutes other parts of the source and drain regions of each memory MC, and a pair of diffused semiconductor regions 12b which constitutes other parts of the source and drain regions of each NMOS. The arsenic is injected therein in the form of, for example, an energy of 60 keV to be injected and a dose of $3\times10^{15}$ cm$^{-2}$.

Figure 20:
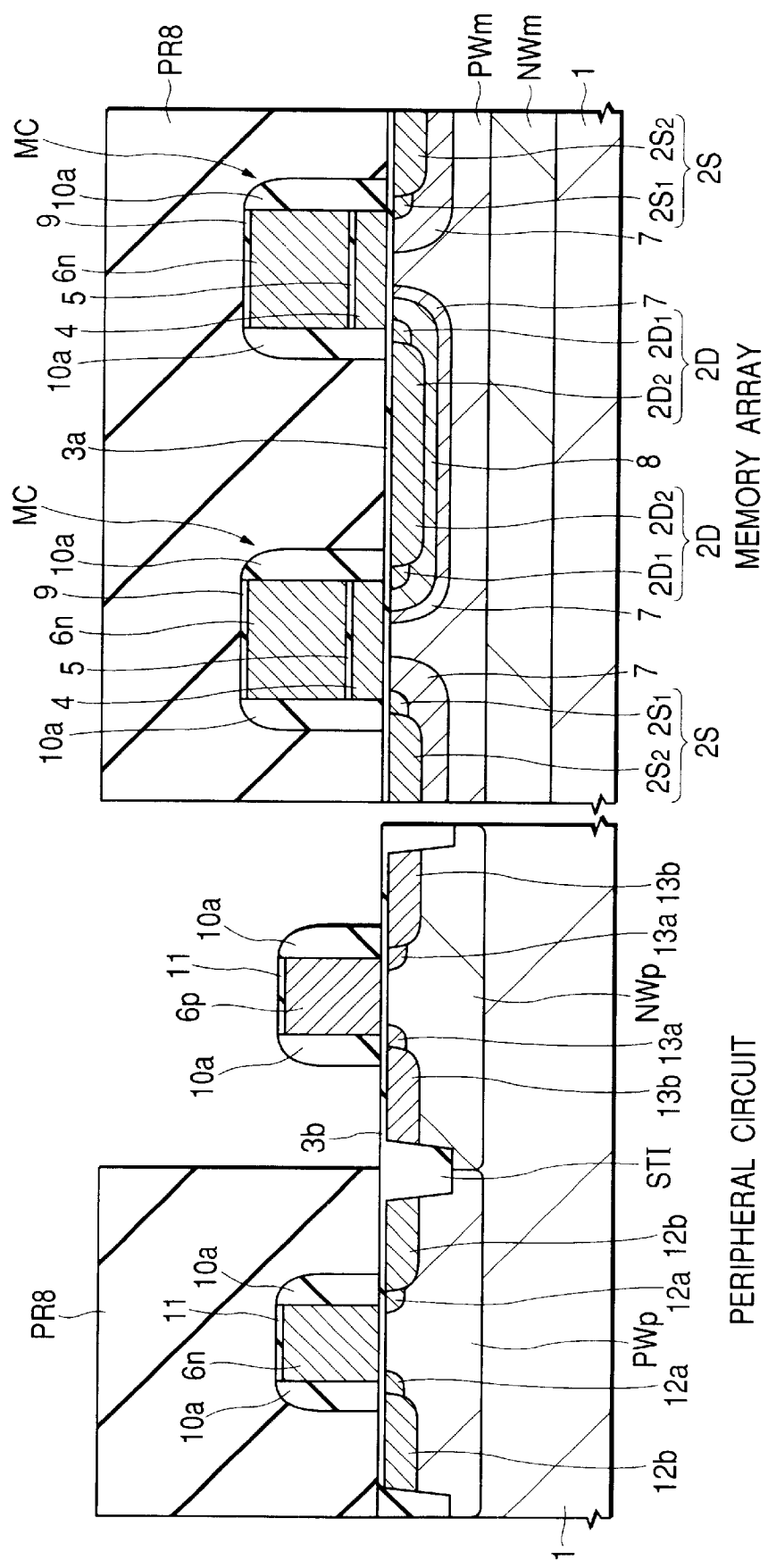
FIG. 20 is a fragmentary cross-sectional view of the semiconductor substrate showing one example of the method of manufacturing the flash memory according to one embodiment of the present invention in process order.

Similarly, the photoresist pattern PR7 is removed. Thereafter, as shown in FIG. 20, the NMOS forming areas for the memory array and each peripheral circuit are covered with photoresist patterns PR8. Further, a p type impurity, e.g., boron fluoride is introduced into its corresponding n well NWp in the peripheral circuit area by the ion implantation method or the like with the gate of each PMOS for the peripheral circuit as a mask to thereby form a pair of diffused semiconductor regions 13b which constitutes other parts of the source and drain regions of each PMOS. The boron fluoride is injected therein in the form of, for example, an energy of 20 keV to be injected and a dose of $2\times10^{15}$ cm$^{-2}$.

Figure 21:
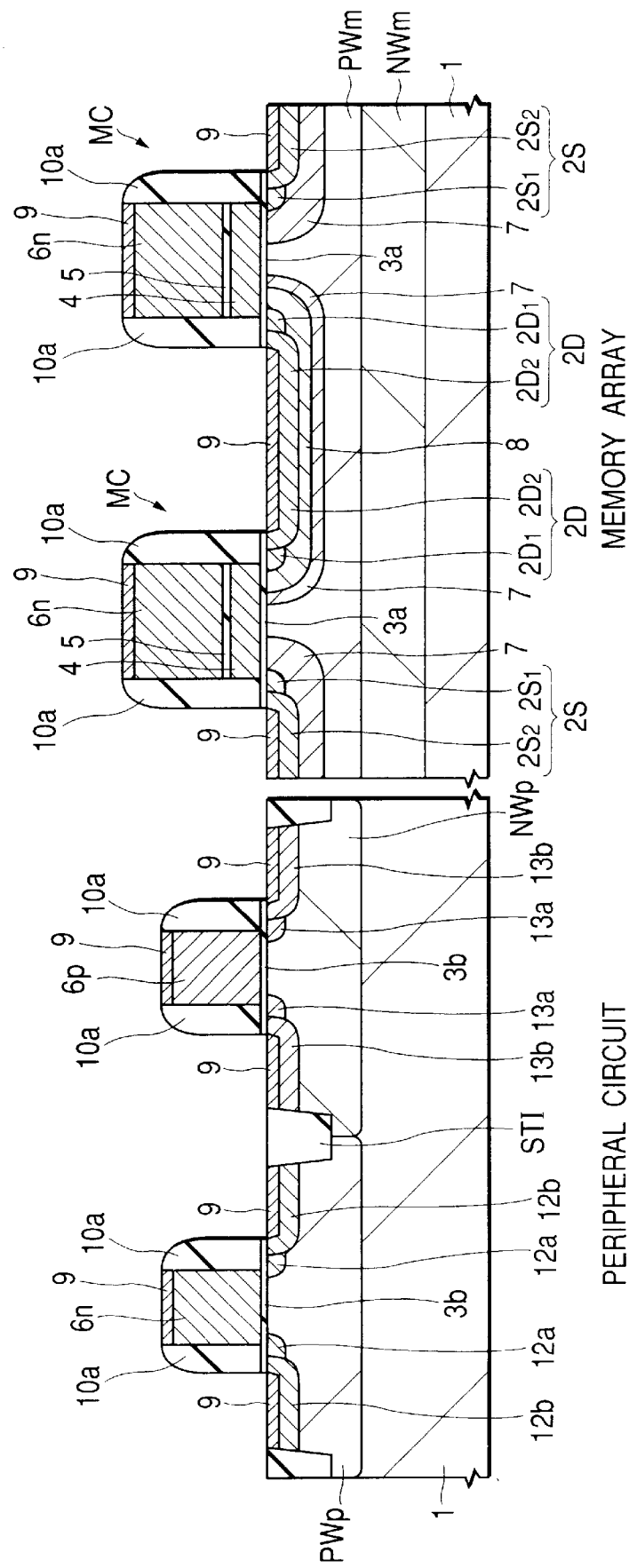
FIG. 21 is a fragmentary cross-sectional view of the semiconductor substrate illustrating one example of the method of manufacturing the flash memory according to one embodiment of the present invention in process order.

Next, the semiconductor substrate 1 is cleaned with a hydrofluoric acid (HF) solution, for example. Thereafter, a cobalt (Co) film having a thickness of about 10 nm is deposited on the semiconductor substrate 1 by a sputtering method, for example. Next, the semiconductor substrate 1 is heat-treated at temperatures ranging from about 500° C. to about 600° C. to thereby selectively form cobalt silicide (CoSi$_x$) films 9 each having a thickness of about 30 nm over the surfaces of the control gate electrodes of the memory cells MC and the surfaces of the n⁺⁺-type semiconductor regions 2S$_2$ and 2D$_2$ for the source and drain regions thereof, the surface of the gate of NMOS for the peripheral circuit and the surfaces of the diffused semiconductor regions 12b for the source and drain regions thereof, and the surface of the gate of PMOS for the peripheral circuit and the surfaces of the diffused semiconductor regions 13b for the source and drain regions thereof, as shown in FIG. 21. Thereafter, non-reacted cobalt is removed and the semiconductor substrate 1 is next heat-treated at temperatures ranging from about 700° C. to about 800° C. for the purpose of reducing the resistance of each cobalt silicide film 9.

Figure 22:
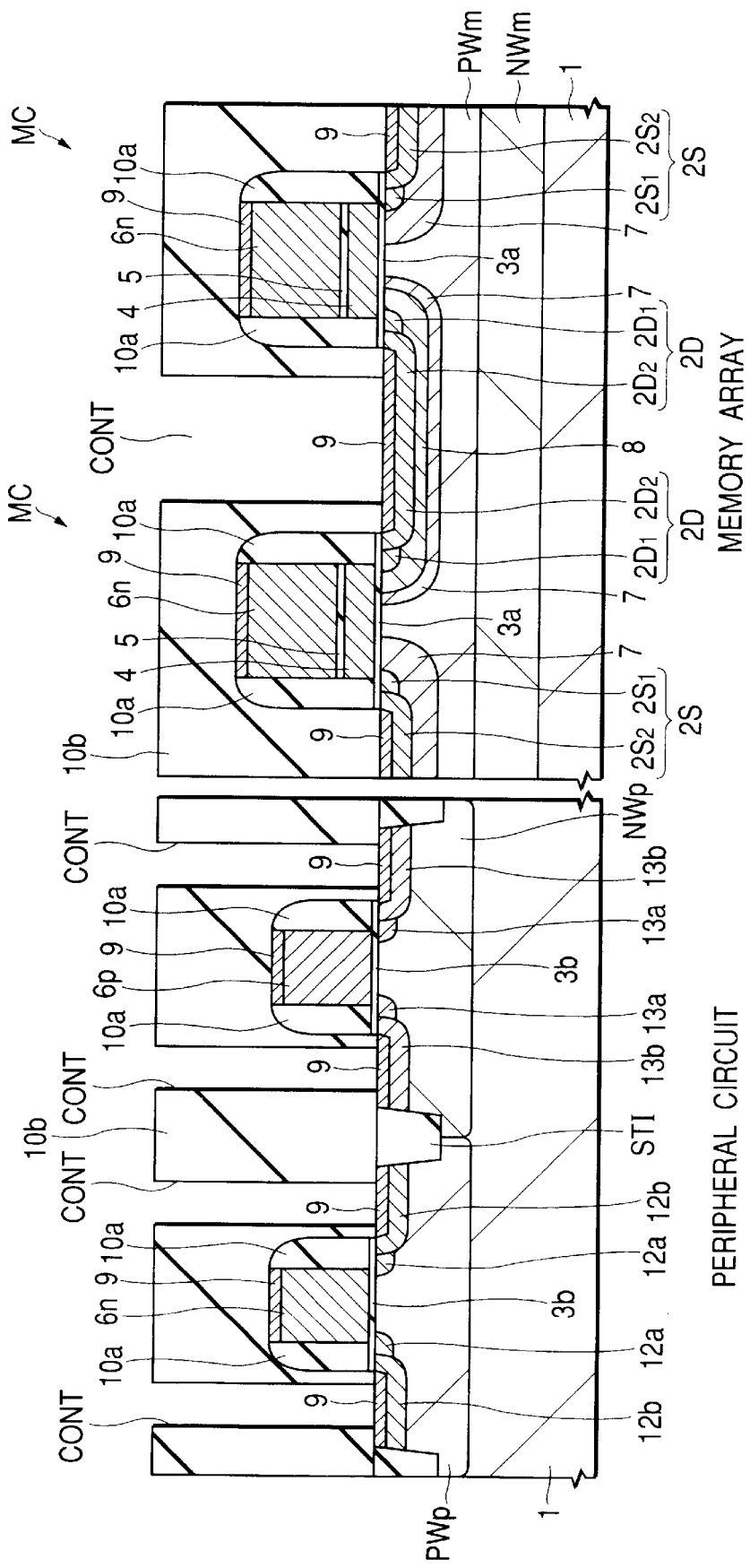
FIG. 22 is a fragmentary cross-sectional view of the semiconductor substrate depicting one example of the method of manufacturing the flash memory according to one embodiment of the present invention in process order.

Next, as shown in FIG. 22, an insulating film 10b formed of, for example, silicon oxide is deposited over the semiconductor substrate 1 by the CVD method or the like. Thereafter, such contact holes CONT as to expose parts of the cobalt silicide films 9 provided over the n⁺⁺-type semiconductor region 2D$_2$ for the drain region of each memory cell MC, the diffused semiconductor regions 12b for the source and drain regions of NMOS for the peripheral circuit, and the diffused semiconductor regions 13b for the source and drain regions of PMOS for the peripheral circuit are defined in the insulating film 10b by a photolithography technology and a dry etching technology. While not illustrated in the drawing at this time, such contact holes that parts or the like of the cobalt silicide films provided over the gates of NMOS for the peripheral circuit and the gates of PMOS therefor are exposed, are defined therein.

Figure 23:
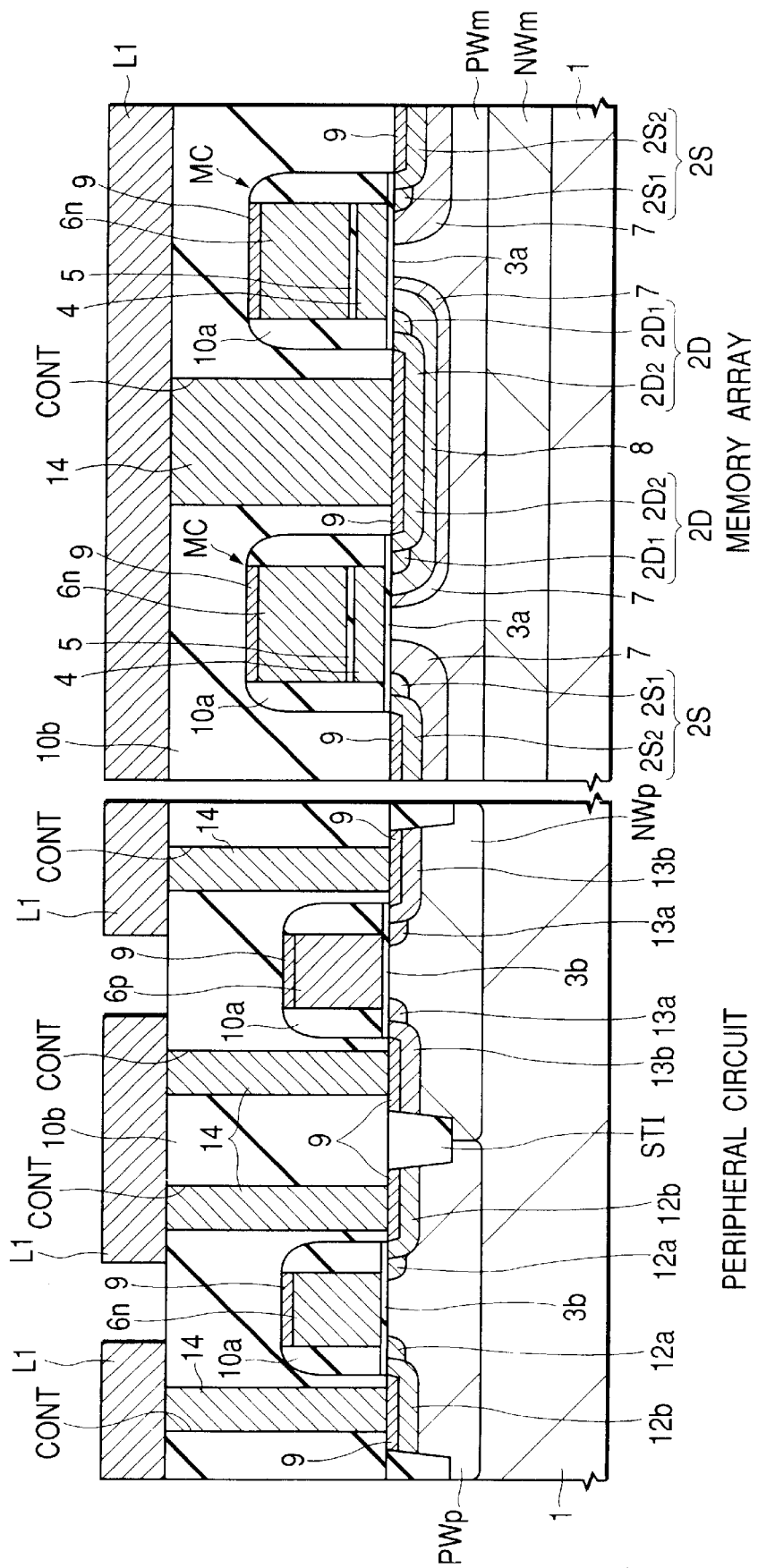
FIG. 23 is a fragmentary cross-sectional view of the semiconductor substrate illustrating one example of the method of manufacturing the flash memory according to one embodiment of the present invention in process order.

Subsequently, as shown in FIG. 23, a metal film like, for example, tungsten (W) or the like is deposited over the semiconductor substrate 1, and the surface of the metal film is flattened by, for example, the CMP method, whereby the metal film is embedded inside the contact holes CONT to form plugs 14. Thereafter, a metal film like, for example, tungsten or the like is deposited over the semiconductor substrate 1 by the sputtering method or the like, followed by patterning by the photolithography technology and the dry etching technology, whereby first layer wirings L1 are formed. The first layer wirings L1 are electrically connected to the n⁺⁺-type semiconductor region 2D$_2$ for the drain region of each memory cell, the diffused semiconductor regions 12b for the source and drain regions of NMOS for the peripheral circuit, and the diffused semiconductor regions 13b for the source and drain regions of PMOS for the peripheral circuit through the contact holes CONT.

Figure 24:
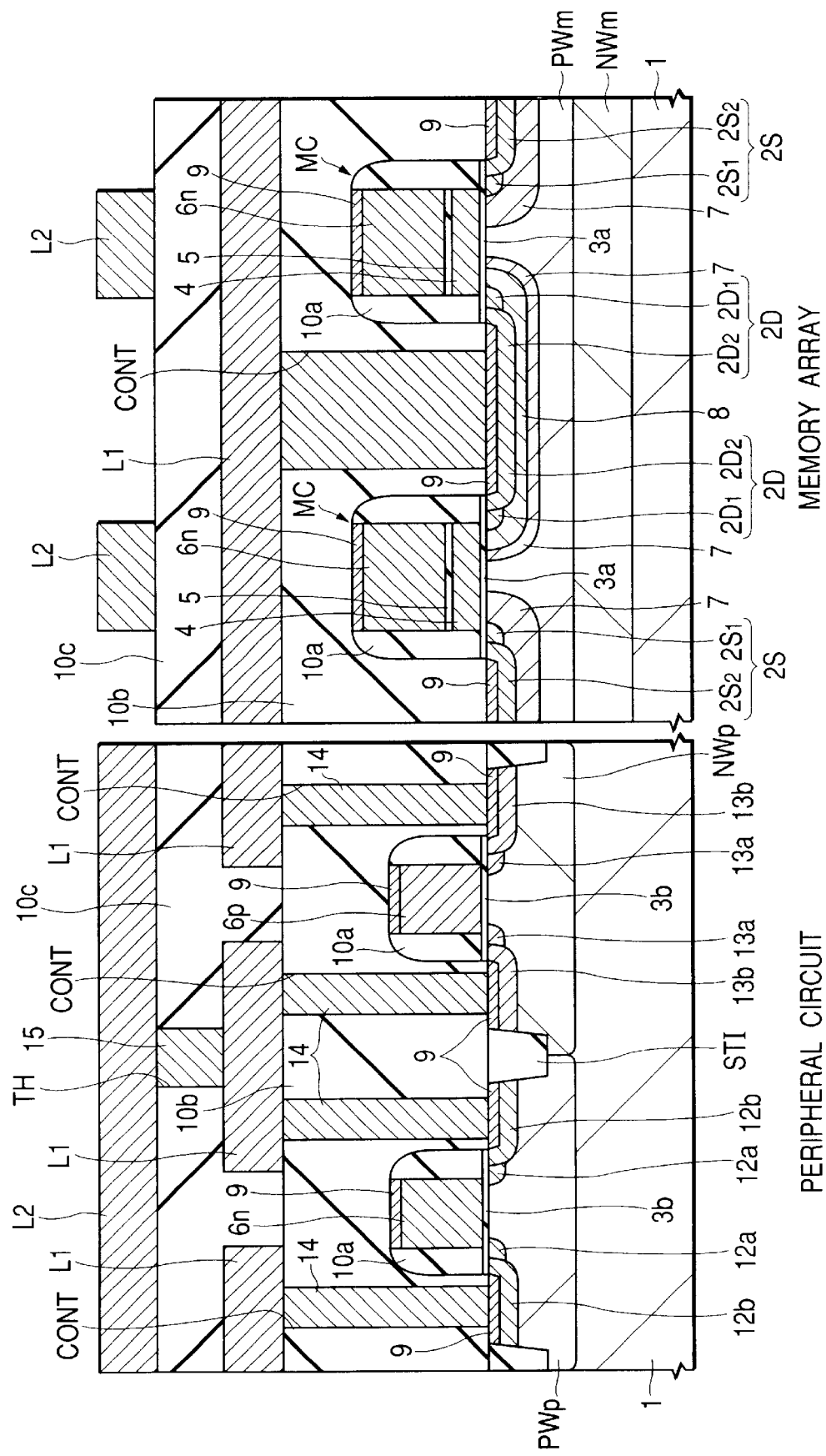
FIG. 24 is a fragmentary cross-sectional view of the semiconductor substrate showing one example of the method of manufacturing the flash memory according to one embodiment of the present invention in process order.
Figure 25:
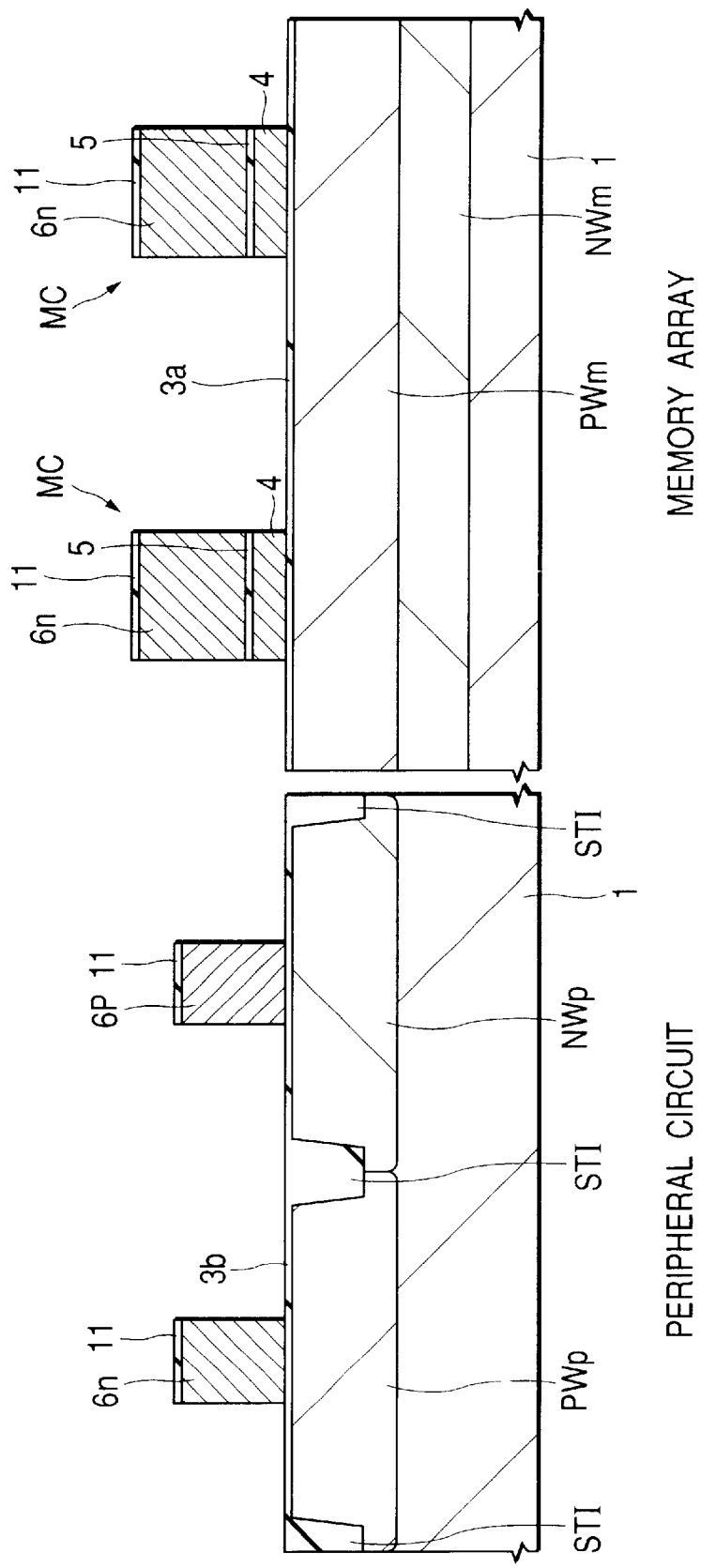
FIG. 25 is a fragmentary cross-sectional view of the semiconductor substrate illustrating one example of the method of manufacturing the flash memory according to one embodiment of the present invention in process order.

Next, as shown in FIG. 24, an insulating film 10c comprising, for example, silicon oxide is deposited over the semiconductor substrate 1 by the CVD method or the like.

Thereafter, such a through hole TH so as to expose part of the first layer wiring L1 is defined in the insulating film 10c by the photolithography technology and the dry etching technology. Subsequently, a metal film like, for example, tungsten or the like is deposited over the semiconductor substrate 1 by the sputtering method or the CVD method or the like. Afterwards, the metal film is polished by the CMP method or the like so as to remain within the through hole TH alone, so that a plug 15 is formed within the through hole TH. Thereafter, for example, titanium nitride, aluminum and titanium nitride are deposited over the semiconductor substrate 1 in order from below by the sputtering method or the like, followed by patterning by means of the photolithography technology and the dry etching technology, whereby a second layer wiring L2 (including a main bit line) is formed. The second layer wiring L2 is electrically connected to the first layer wiring L1 through the plug 15.

Thereafter, each wiring above the second layer wiring L2 is formed over the semiconductor substrate. Further, a surface protective film is further formed thereon and thereafter such an opening that part of the uppermost layer wiring is exposed in part thereof, is defined, followed by formation of bonding pads, whereby a flash memory is manufactured.

Incidentally, while the present embodiment 1 has illustrated the case in which only the relatively low-voltage NMOS and PMOS for each peripheral circuit, whose drive voltages range from, for example, about 1.8 V to about 3.3 V, are formed in the peripheral circuit area, as one example of the method of manufacturing the flash memory. However, the present invention is applicable even to a method of manufacturing a flash memory wherein relatively high-voltage NMOS and PMOS or the like for each peripheral circuit, whose drive voltages are 8 V, for example, are formed.

While the present embodiment 1 has described the case where after the n⁻-type semiconductor region 8 has been formed on the drain side of each memory cell MC, the extended semiconductor regions 12a which constitute parts of the source and drain regions of NMOS for the peripheral circuit and the extended semiconductor regions 13a which constitute parts of the source and drain regions of PMOS, are formed, the n⁻-type semiconductor region 8 may be formed on the drain side of each memory cell MC after the extended semiconductor regions 12a which constitute parts of the source and drain regions of NMOS for the peripheral circuit and the extended semiconductor regions 13a which constitute parts of the source and drain regions of PMOS, have been formed. An effect similar to the above is obtained.

In the present embodiment 1, the n⁺-type semiconductor regions $2S_1$ and $2D_1$, the punch-through stopper layers 7 and the n⁻-type semiconductor region 8, which constitute parts of the source and drain regions of the memory cells MC, are formed by introducing the respective impurities into the p well PWm of the memory array by the ion implantation method or the like. However, the introduction of these impurities may be used for the formation of the NMOS and PMOS semiconductor regions for the peripheral circuit.

In the present embodiment 1, the punch-through stopper layers 7 for the memory cells MC are formed on both sides of the source and drain regions so as to surround the n type semiconductor regions 2S and 2D which constitute the source and drain regions. However, they may be formed on the drain side alone. It is possible to suppress the short channel effect and prevent the punch-through.

Typical advantageous effects of the present embodiment 1 will be described as follows, for example.

(1) Forming a punch-through stopper layer 7 so as to surround the source and drain regions of each memory cell MC allows the prevention of a short channel effect of the memory cell MC whose gate length is 0.3 μm or less (the First effect).

(2) Forming the punch-through stopper layer 7 so as to surround the source and drain regions of each memory cell MC makes it possible to reduce variations in current at data reading (the Second effect).

(3) Since an n⁻-type semiconductor region 8 is provided between an n type semiconductor region 2D for forming the drain region of each memory cell MC and its corresponding punch-through stopper layer 7, an electric filed at a junction of the punch-through stopper layer 7 is relaxed. Thus, even if the punch-through stopper layers 7 each having the function of preventing a short channel effect are provided and a negative voltage is applied to a control gate electrode of each non-selected memory cell to reduce a leak current of the non-selected memory cell upon writing, a drain disturb phenomenon can be prevented from occurring (the Third effect).

(4) The provision of a punch-through stopper layer 7 and an n⁻-type semiconductor region 8 under a floating gate electrode of each memory cell MC makes it possible to improve the efficiency of writing of data into each memory cell MC (the efficiency of injection of HE) (the Fourth effect).

(5) Since the n⁻-type semiconductor region 8 cancels the punch-through stopper layer 7 at the drain end of each memory cell MC, it is possible to prevent a reduction in the degree of motion of carriers at the drain end and increase a current at data reading. Further, the time required up to the determination of data at data reading can be shortened (the Fifth effect).

Embodiment 2

The present embodiment 2 describes another manufacturing method used when the structure of FIG. 6 described in the embodiment 1 is formed.

FIGS. 25 through 28 for describing the present embodiment 2 respectively show fragmentary cross-sectional views of the semiconductor substrate 1 subsequent to the manufacturing process described in FIGS. 9 through 13 in the embodiment 1.

A two-layer gate electrode structure of each memory cell MC, which is formed by stacking the conductor film 6n for the control gate electrode on the conductor film 4 for the floating gate electrode with the interlayer film 5 interposed therebetween, is formed in the memory array. An NMOS gate formed of the conductor film 6n and a PMOS gate formed of the conductor film 6p are formed in the peripheral circuit area.

Figure 26:
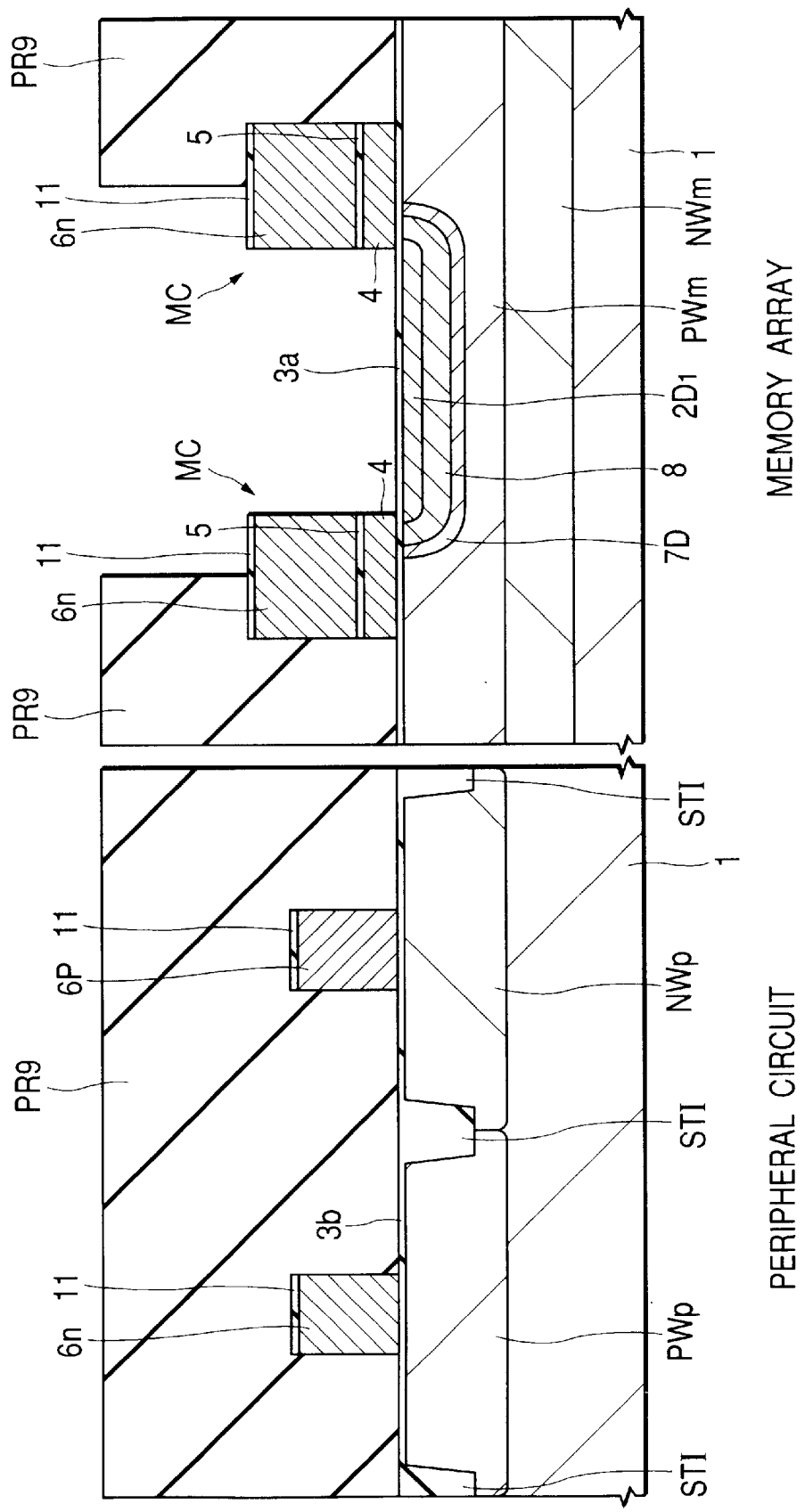
FIG. 26 is a fragmentary cross-sectional view of the semiconductor substrate showing one example of the method of manufacturing the flash memory according to one embodiment of the present invention in process order.

Next, as shown in FIG. 26, a photoresist pattern PR9 in which only the drain side of each memory cell MC is made open, is formed, and an n type impurity, e.g., arsenic is introduced into its corresponding p well PWm by the ion implantation method or the like with the gates (control and floating gate electrodes) of the memory cell MC as masks, whereby an n⁻-type semiconductor region 2D1, which constitutes part of the drain region of each memory cell MC, is formed. The arsenic is injected therein in the form of an energy of 30 keV to be injected and a dose of $1 \times 10^{15}$ cm⁻², fore example. Further, phosphorus corresponding to an n type impurity is introduced into its corresponding p well PWm by the ion implantation method or the like with the photoresist pattern PR9 as a mask to thereby form an n⁻-type semiconductor region 8 which surrounds the n⁺-type semiconductor region $2D_1$ and is diffused to below the floating gate electrode. The phosphorus is injected therein in the form of, for example, an energy of 60 keV to be injected and a dose of $2\times10^{14}$ cm$^{-12}$. Further, a p-type impurity, e.g., boron is introduced into its corresponding P well PWm by the ion implantation method or the like with the photoresist pattern PR9 as a mask to thereby form a punch-through stopper layer 7D (second semiconductor region) which surrounds the n$^-$-type semiconductor region 8 and is diffused to below the floating gate electrode. The boron is injected therein in the form of, for example, an energy of 40 keV to be injected and a dose of $2\times10^{13}$ cm$^{-3}$ at an angle made to the direction of the normal to the semiconductor substrate 1.

Figure 27:
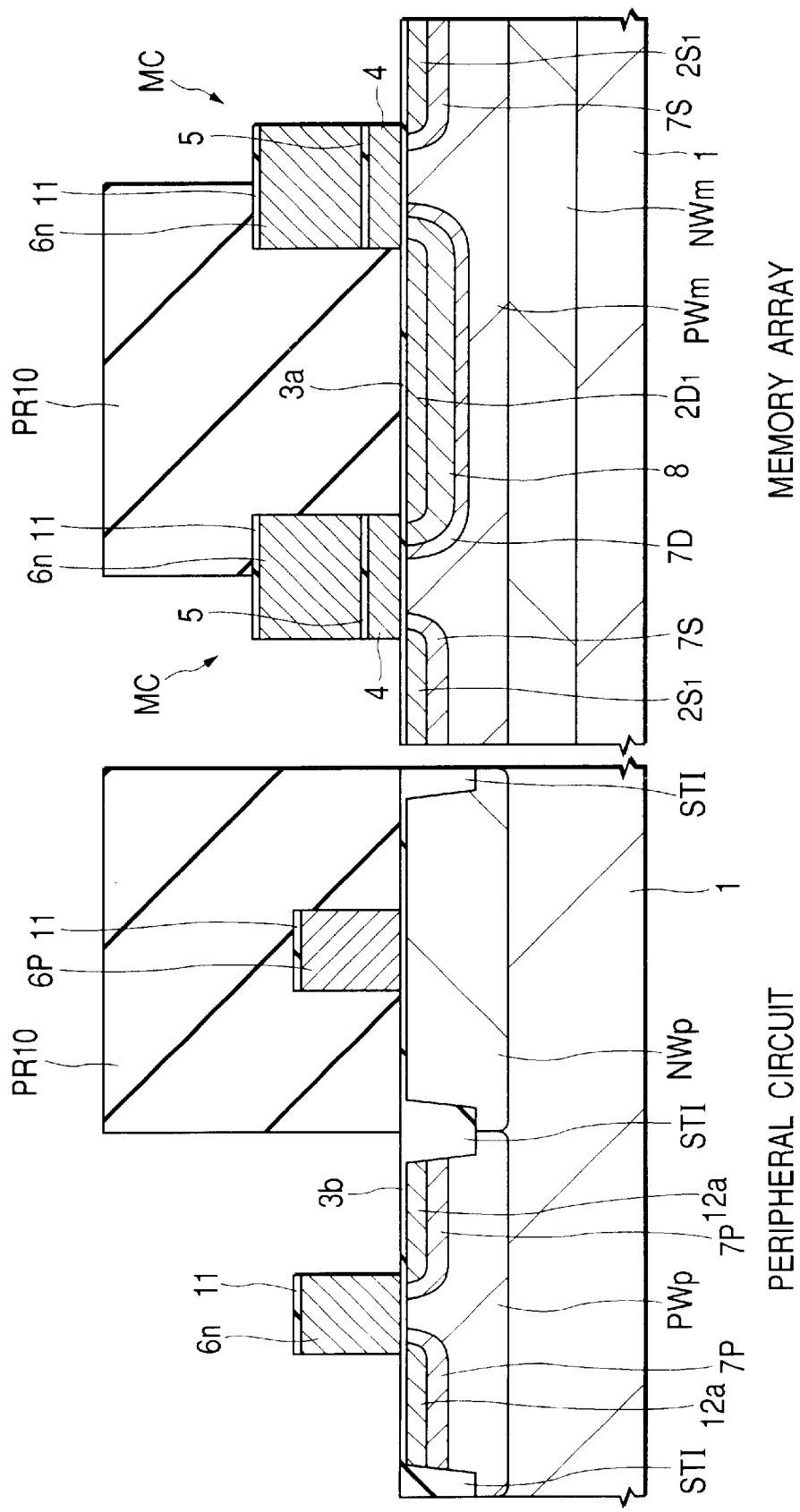
FIG. 27 is a fragmentary cross-sectional view of the semiconductor substrate illustrating one example of the method of manufacturing the flash memory according to one embodiment of the present invention in process order.

Next, the photoresist pattern PR9 is removed. Thereafter, as shown in FIG. 27, the drain side of each memory cell MC and the PMOS forming region for the peripheral circuit are covered with their corresponding photoresist patterns PR10. An n type impurity, e.g., arsenic is introduced into its corresponding p well PWm of the memory array by the ion implantation method or the like with the gates (control and floating gate electrodes) of the memory cells MCs to thereby form n$^+$-type semiconductor regions $2S_1$ which constitute parts of the source regions of the memory cells MCs. Simultaneously, the n type impurity is introduced into its corresponding p well PWp in the peripheral circuit area by the ion implantation method or the like with the gate of NMOS for the peripheral circuit as a mask to thereby form a pair of diffused semiconductor regions 12a which constitutes parts of the source and drain regions of NMOS. The arsenic is injected therein in the form of, for example, an energy of 30 keV to be injected and a dose of $3\times10^{14}$ cm$^{-2}$.

Further, a p type impurity, e.g., boron is introduced into its corresponding p well PWm of the memory array by the ion implantation method or the like with the photoresist pattern PR10 as a mask to thereby form punch-through stopper layers 7S (each corresponding to a second semiconductor region) each of which surrounds the n$^+$-type semiconductor region $2S_1$ and is diffused to below the floating gate electrode. Simultaneously, the p type impurity is introduced into its corresponding p well PWp in the peripheral circuit area by the ion implantation method or the like with the gate of NMOS for the peripheral circuit as a mask to thereby form punch-through stopper layers 7P which surround the pair of diffused semiconductor regions 12a that constitutes parts of the source and drain regions of NMOS. The boron is injected therein in the form of, for example, an energy of 30 keV to be injected and a dose of $2\times10^{13}$ cm$^{-3}$ at an angle made to the direction of the normal to the semiconductor substrate 1.

Figure 28:
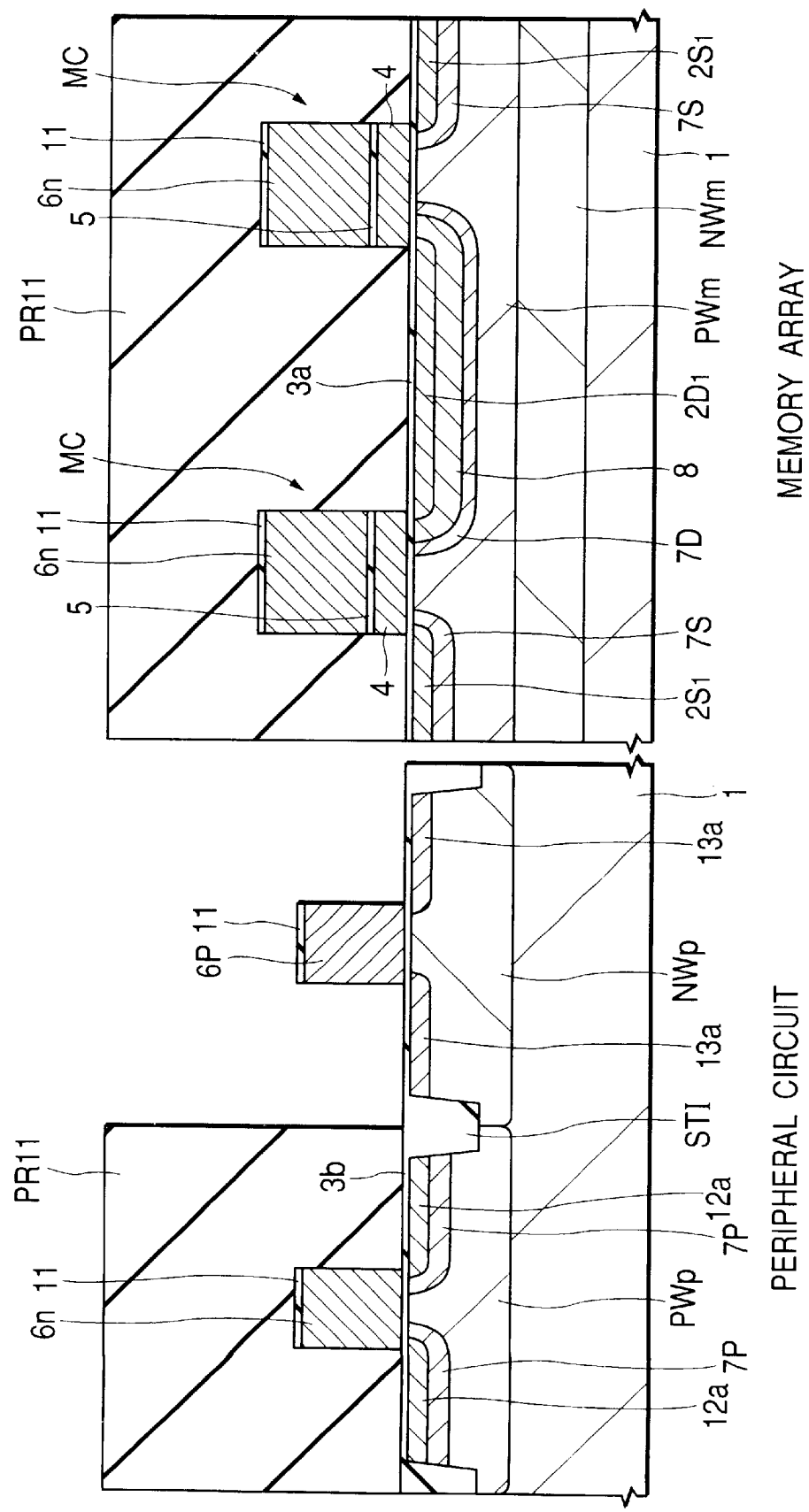
FIG. 28 is a fragmentary cross-sectional view of the semiconductor substrate depicting one example of the method of manufacturing the flash memory according to one embodiment of the present invention in process order.

Next, the photoresist patterns PR10 are removed. Thereafter, as shown in FIG. 28, the NMOS forming areas for the memory array and the peripheral circuit are covered with their corresponding photoresist patterns PR11, and a p type impurity, e.g., boron fluoride is introduced into its corresponding n well NWp in the peripheral circuit area by the ion implantation method or the like with the gate of PMOS for the peripheral circuit as a mask to thereby form a pair of diffused semiconductor regions 13a which constitutes parts of the source and drain regions of PMOS. The boron fluoride is injected therein in the form of, for example, an energy of 70 keV to be injected and a dose of $1\times10^{13}$ cm$^{-2}$.

Since the subsequent processes are identical to ones described using the drawings subsequent to FIG. 19 of the embodiment 1, the description thereof will be omitted.

Incidentally, while the present embodiment 2 has shows the case in which the diffused semiconductor regions 12a which constitute the parts of the source and drain regions of NMOS for the peripheral circuit, are formed in the same process as the n$^+$-type semiconductor region $2S_1$ that constitutes the source region of each memory cell MC in the memory array. However, the diffused semiconductor regions 12a may be formed in processes (photolithography process and ion implantation process) different from one for the n$^+$-type semiconductor region $2S_1$. Alternatively, the diffused semiconductor regions 12a may be formed by introducing the n type impurity into its corresponding p well PWm by the ion implantation method or the like in the same process as the n$^+$-type semiconductor region $2S_1$ and introducing the n type impurity into the p well PWm by the ion implantation method in a different process.

Thus, according to the present embodiment 2, an n type semiconductor region 2S, which constitutes the source region of each memory cell MC, and an n type semiconductor region 2D which constitutes the drain region thereof, are respectively formed in different processes. Consequently, an n type semiconductor region 2S having an impurity concentration distribution suited for the source region and an n type semiconductor region 2D having an impurity concentration distribution suited for the drain region can be formed respectively.

While the invention made above by the present inventors has been described specifically by the illustrated embodiments, the present invention is not limited to the embodiments. It is needless to say that various changes can be made thereto within the scope not departing from the substance thereof.

While the aforementioned embodiment has described, for example, the case in which the invention made by the present inventors is applied to the single flash memory which belongs to the field of application corresponding to the background of the invention, the present invention is not limited to it. The present invention can be applied even to, for example, a mixed type semiconductor device wherein a flash memory and a logic circuit are provided on the same semiconductor substrate.

Advantageous effects obtained by typical ones of the inventions disclosed in the present application will be descried in brief as follows:

According to the present invention, an n$^-$-type semiconductor region substantially lower than a drain region of a memory cell in impurity concentration is formed between the drain region thereof and a punch-through stopper layer, so that an electric field at a junction of the punch-through stopper layer is relaxed. Thus, even if the punch-through stopper layer having the function of preventing a short channel effect is provided and a negative voltage is applied to a control gate electrode of each non-selected memory cell to suppress a leak current developed in the non-selected memory cell upon writing, a drain disturb phenomenon developed in the non-selected memory cell can be prevented from occurring.

Further, according to the present invention, since a punch-through stopper layer and the n$^-$-type semiconductor region are provided below a floating gate electrode of the memory cell, a channel region to which an electric field lying in a channel horizontal direction is applied, becomes wide and hence the number of electrons accelerated until they have energy necessary for the injection of HE, increases. It is thus possible to enhance the efficiency of the injection of HE upon writing and achieve the speeding up of a write operation.

Furthermore, according to the present invention, since the n$^-$-type semiconductor region cancels the punch-through stopper layer at a drain end of the memory cell, it is possible to prevent a reduction in the degree of motion of carriers at the drain end and increase a current at data reading. Thus, the time required up to the determination of data at the data reading can be shortened.

What is claimed is:

1. A semiconductor device comprising:
    a plurality of nonvolatile memory cells arranged on a semiconductor substrate in matrix form, each including,
        a gate insulating film covering a channel region in a main surface of the semiconductor substrate of a first conductivity type, a floating gate electrode, an interlayer film and a control gate electrode successively formed;
        source and drain regions of a second conductivity type formed in the semiconductor substrate on both sides opposite to each other, of the floating gate electrode so as to interpose a channel region located under the floating gate electrode therebetween;
        a first semiconductor region which is adjacent to the drain region and formed by introducing an impurity of the second conductivity type in the direction of the channel region placed under the floating gate electrode from an end on the drain side, of the floating gate electrode, and which has an impurity concentration relatively lower than that of the drain region; and
        a second semiconductor region which is adjacent to the first semiconductor region and formed by introducing an impurity of the first conductivity type in the direction of the channel region placed under the floating gate electrode from an end on the drain side, of the floating gate electrode, and which has an impurity concentration relatively higher than that of the channel region,
    wherein the control gate electrode is electrically connected to its corresponding word line, and a negative voltage is applied to each non-selected word line upon a write operation.

2. The semiconductor device according to claim 1, wherein the impurity of the second conductivity type, which constitutes the first semiconductor region, is phosphorus.

3. The semiconductor device according to claim 1, wherein storage of the carriers in the floating gate electrode of the nonvolatile memory cell is carried out by hot-electron injection of electrons having obtained high energy in the neighborhood of the end of the drain region into the floating gate electrode.

4. The semiconductor device according to claim 1, wherein discharge of carriers from the floating gate electrode of the nonvolatile memory cell is carried out by tunnel emission of the electrons in the floating gate electrode into the semiconductor substrate.

5. The semiconductor device according to claim 1, further including a third semiconductor region which is adjacent to the source region and formed by introducing an impurity of the first conductivity type in the direction of the channel region placed under the floating gate electrode from an end on the source side, of the floating gate electrode, and which has an impurity concentration relatively higher than that of the channel region.

6. The semiconductor device according to claim 1, wherein the source and drain regions comprise a low-concentration semiconductor region of relatively low impurity concentration and a high-concentration semiconductor region of relatively high impurity concentration, and the first semiconductor region, the low-concentration semiconductor region, and the high-concentration semiconductor region are formed in order from the side that faces the channel region.

7. A semiconductor device comprising:
    a plurality of nonvolatile memory cells arranged on a semiconductor substrate in matrix form, each including,
        a gate insulating film covering a channel region in a main surface of the semiconductor substrate of a first conductivity type, a floating gate electrode, an interlayer film and a control gate electrode successively formed;
        source and drain regions of a second conductivity type formed in the semiconductor substrate on both sides opposite to each other, of the floating gate electrode so as to interpose a channel region located under the floating gate electrode therebetween;
        a first semiconductor region which is adjacent to the drain region and formed by introducing an impurity of a second conductivity type in the direction of the channel region placed under the floating gate electrode from an end on the drain side, of the floating gate electrode, and which has an impurity concentration relatively lower than that of the drain region; and
        a second semiconductor region which is adjacent to the first semiconductor region and formed by introducing an impurity of the first conductivity type in the direction of the channel region placed under the floating gate electrode from an end on the drain side, of the floating gate electrode, and which has an impurity concentration relatively higher than that of the channel region,
    wherein the source and drain regions of the plurality of nonvolatile memory cells are parallel-connected to one another in respective columns,
    wherein word lines which constitute the control gate electrodes of the plurality of nonvolatile memory cells, extend in respective rows,
    wherein a voltage is applied to at least one word line, which is set so as to serve as a selected word line, and
    wherein when carriers are stored in a floating gate electrode of a nonvolatile memory cell connected to the selected word line, a negative voltage is applied to other non-selected word lines other than the selected word line.

8. The semiconductor device according to claim 7, wherein the impurity of the second conductivity type, which constitutes the first semiconductor region, is phosphorus.

9. The semiconductor device according to claim 7, wherein the storage of the carriers in the floating gate electrode of the nonvolatile memory cell is carried out by hot-electron injection of electrons having obtained high energy in the neighborhood of the end of the drain region into the floating gate electrode.

10. The semiconductor device according to claim 7, wherein the discharge of carriers from the floating gate electrode of the nonvolatile memory cell is carried out by tunnel emission of the electrons in the floating gate electrode into the semiconductor substrate.

11. The semiconductor device according to claim 7, further including a third semiconductor region which is adjacent to the source region and formed by introducing an impurity of the first conductivity type in the direction of the channel region placed under the floating gate electrode from an end on the source side, of the floating gate electrode, and which has an impurity concentration relatively higher than that of the channel region.

12. The semiconductor device according to claim 7, wherein the source and drain regions comprise a low-concentration semiconductor region of relatively low impurity concentration and a high-concentration semiconductor region of relatively high impurity concentration, and the first semiconductor region, the low-concentration semiconductor region, and the high-concentration semiconductor region are formed in order from the side that faces the channel region.

13. A semiconductor device comprising:
- a plurality of nonvolatile memory cells arranged on a semiconductor substrate in matrix form, each including
  - a gate insulating film covering a channel region in a main surface of the semiconductor substrate of a first conductivity type, a floating gate electrode, an interlayer film and a control gate electrode successively formed;
  - source and drain regions of a second conductivity type formed in the semiconductor substrate on both sides opposite to each other, of the floating gate electrode so as to interpose a channel region located under the floating gate electrode therebetween;
  - a first semiconductor region which is adjacent to the drain region and formed by introducing an impurity of the second conductivity type in the direction of the channel region placed under the floating gate electrode from an end on the drain side, of the floating gate electrode, and which has an impurity concentration relatively lower than that of the drain region; and
  - a second semiconductor region which is adjacent to the first semiconductor region and formed by introducing an impurity of the first conductivity type in the direction of the channel region placed under the floating gate electrode from an end on the drain side, of the floating gate electrode, and which has an impurity concentration relatively higher than that of the channel region, wherein the control gate electrode is electrically connected to a corresponding word line, and a negative voltage is applied to each non-selected word line upon a write operation, wherein storage of the carriers in the floating gate electrode of the nonvolatile memory cell is carried out by hot-electron injection of electrons having obtained high energy in the neighborhood of the end of the drain region into the floating gate electrode, and wherein the source and drain regions comprise a low-concentration semiconductor region of relatively low impurity concentration and a high-concentration semiconductor region of relatively high impurity concentration, and the first semiconductor region, the low-concentration semiconductor region, and the high-concentration semiconductor region are formed in order from the side that faces the channel region.

14. The semiconductor device according to claim 13, wherein the impurity of the second conductivity type, which constitutes the first semiconductor region, is phosphorus.

* * * * *